United States Patent
Tsai et al.

(10) Patent No.: US 10,109,668 B2
(45) Date of Patent: Oct. 23, 2018

(54) PIXEL STRUCTURE OF AN IMAGE SENSOR AND FABRICATION METHOD THEREOF

(71) Applicant: TAIWAN SEMICONDUCTOR MANUFACTURING CO., LTD., Hsinchu (TW)

(72) Inventors: Bo-Tsung Tsai, Kaohsiung (TW); Hung-Da Dai, Tainan (TW); Mao-Yi Sun, Tainan (TW); Wei-Li Hu, Tainan (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 15/463,118

(22) Filed: Mar. 20, 2017

(65) Prior Publication Data

US 2018/0269249 A1   Sep. 20, 2018

(51) Int. Cl.
*H01L 27/146* (2006.01)

(52) U.S. Cl.
CPC .... *H01L 27/14643* (2013.01); *H01L 27/1461* (2013.01); *H01L 27/1462* (2013.01); *H01L 27/14614* (2013.01); *H01L 27/14685* (2013.01); *H01L 27/14689* (2013.01)

(58) Field of Classification Search
CPC ........... H01L 31/035254; H01L 29/157; H01L 29/155; H01L 31/035245; H01L 31/035263; H01L 27/14643; H01L 27/14665; H01L 31/10; H01L 21/761; H01L 21/823878; H01L 27/14609; H01L 27/1461; H01L 27/14612; H01L 27/14654; H01L 27/14683; H01L 27/14685
See application file for complete search history.

(56) References Cited

U.S. PATENT DOCUMENTS 9,136,407 B2 * 9/2015 Tsuchiya ............. H01L 27/1461
2013/0037900 A1 * 2/2013 Abe ................... H01L 27/14603
257/431

* cited by examiner

*Primary Examiner* — Sonya D McCall Shepard
(74) *Attorney, Agent, or Firm* — McClure, Qualey & Rodack, LLP

(57) ABSTRACT

A pixel structure of an image sensor and fabrication methods thereof are provided. The pixel structure includes a semiconductor substrate and plural pixel units disposed on the semiconductor substrate. The pixel units are electrically connected to each other, and each of the pixel units includes a light-sensitive region, a transfer gate and a protection layer. A terminal portion of the protection layer is covered by the transfer gate, and a width of the terminal portion of the protection layer is progressively decreased along a depth-wise direction of the terminal portion of the protection layer. In the fabrication methods of the pixel structure, the protection layers of the pixel units are formed by doping with a tilt angle, so as to form the terminal portion of the protection layer.

20 Claims, 40 Drawing Sheets

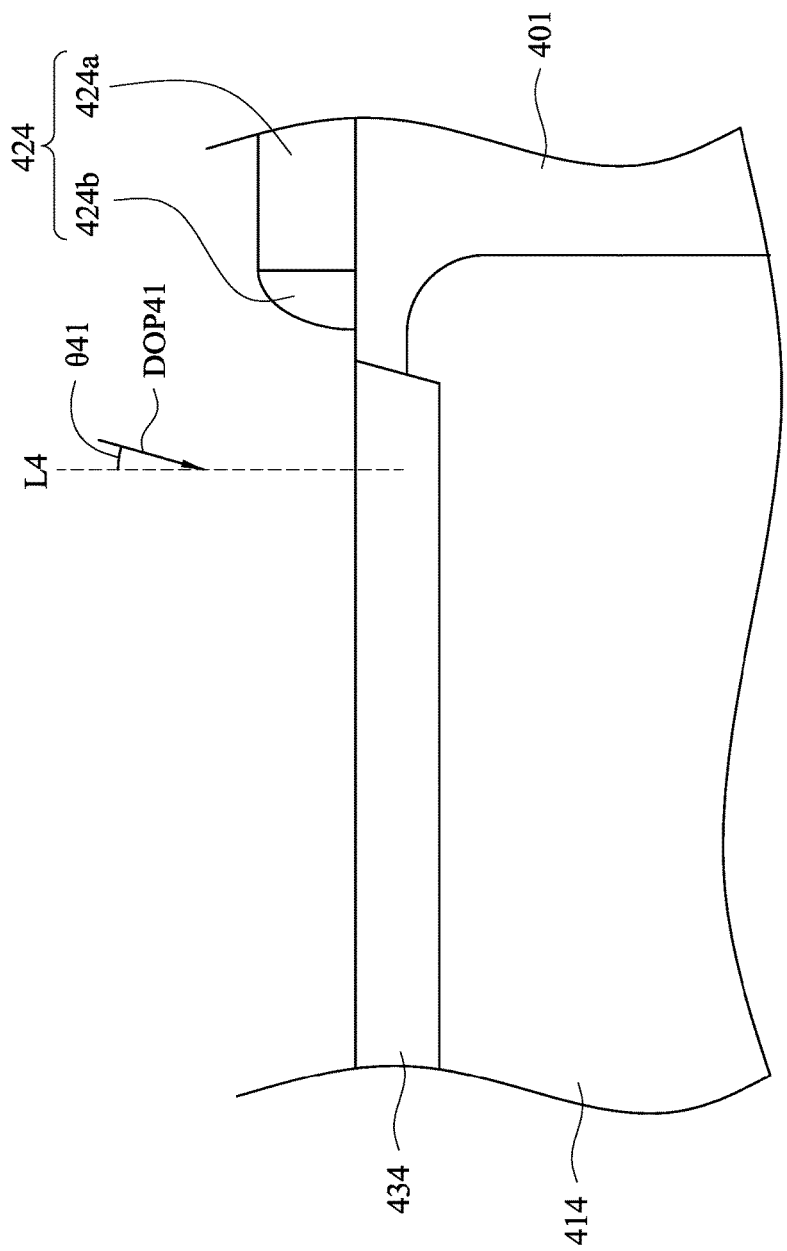
Fig. 4D"

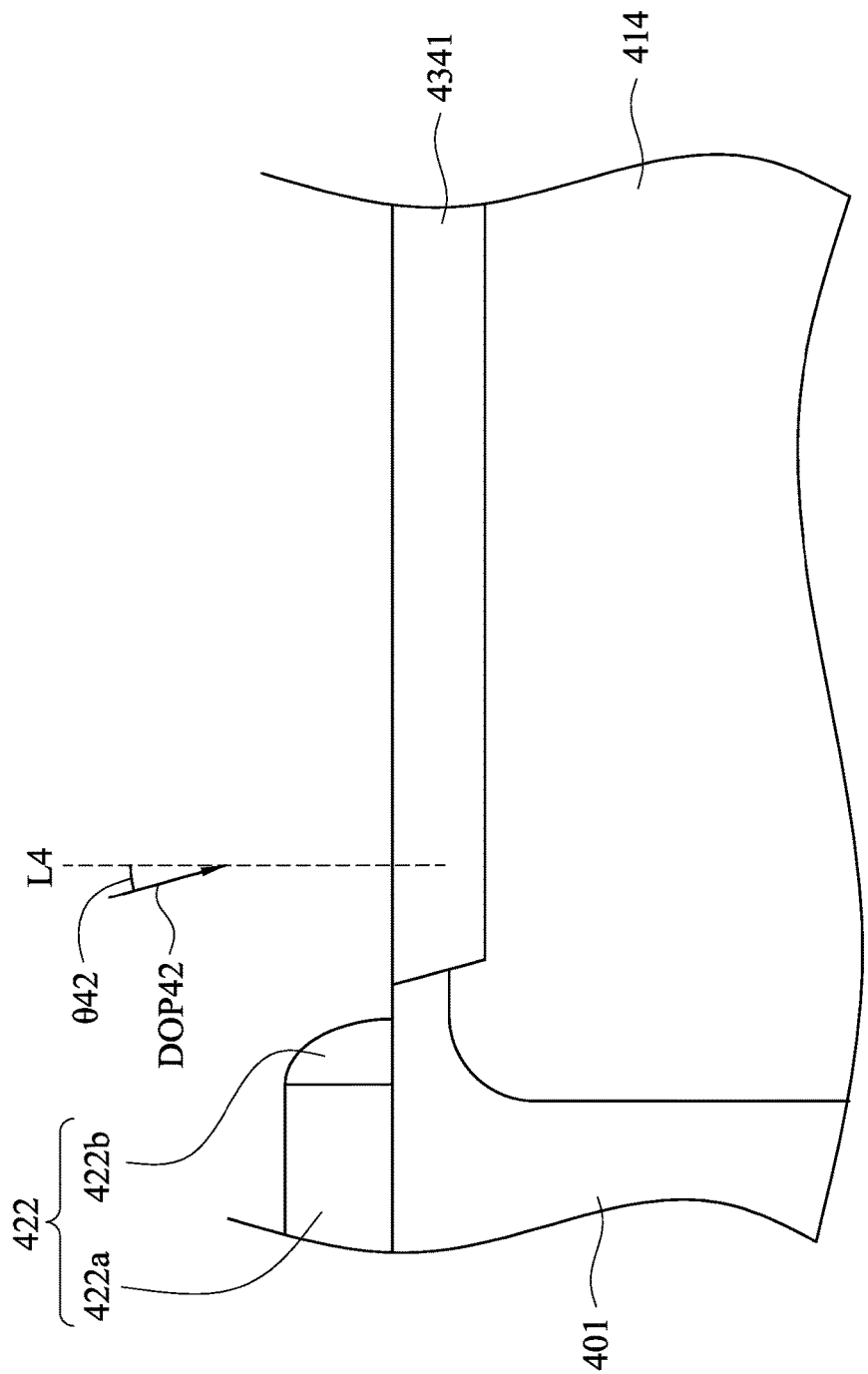
Fig. 4E"

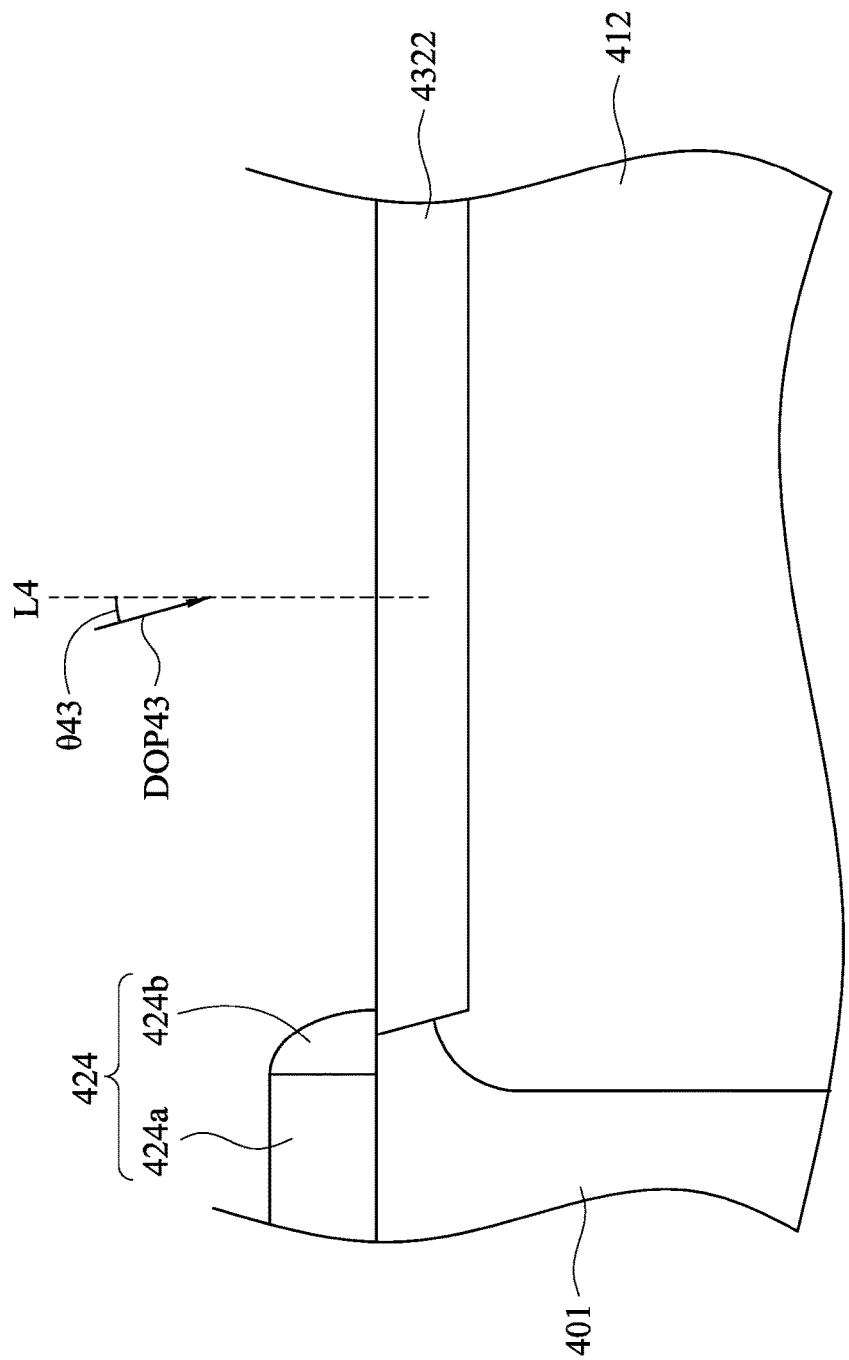
Fig. 4F"

PIXEL STRUCTURE OF AN IMAGE SENSOR AND FABRICATION METHOD THEREOF

BACKGROUND

In semiconductor technology, image sensors are used for sensing light emitted towards them to form an image. For converting various photo energy of the light into electrical signals, the image sensor includes pixels having photosensitive diodes, reset transistors, source follower transistors, pinned layer photodiodes, and/or transfer transistors. In general, the image sensor may be a complementary metal-oxide-semiconductor (CMOS) image sensor (CIS), an active-pixel sensor (APS), a passive-pixel sensor and a charged-coupled device (CCD) sensor. The above image sensor is widely used in various applications such as digital camera or mobile phone camera devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A', FIG. 2B', FIG. 2C', FIG. 2D', FIG. 2E', FIG. 2F', FIG. 2G' and FIG. 2H' are schematic cross-sectional views of the intermediate stages shown in FIG. 2A, FIG. 2B, FIG. 2C, FIG. 2D, FIG. 2E, FIG. 2F, FIG. 2G and FIG. 2H.

FIG. 4A', FIG. 4B', FIG. 4C', FIG. 4D', FIG. 4D'', FIG. 4E', FIG. 4E'', FIG. 4F', FIG. 4F'', FIG. 4G' and FIG. 4G'' are schematic cross-sectional views of the intermediate stages shown in FIG. 4B, FIG. 4C, FIG. 4D, FIG. 4E, FIG. 4F and FIG. 4G.

DETAILED DESCRIPTION

Figure 1A:
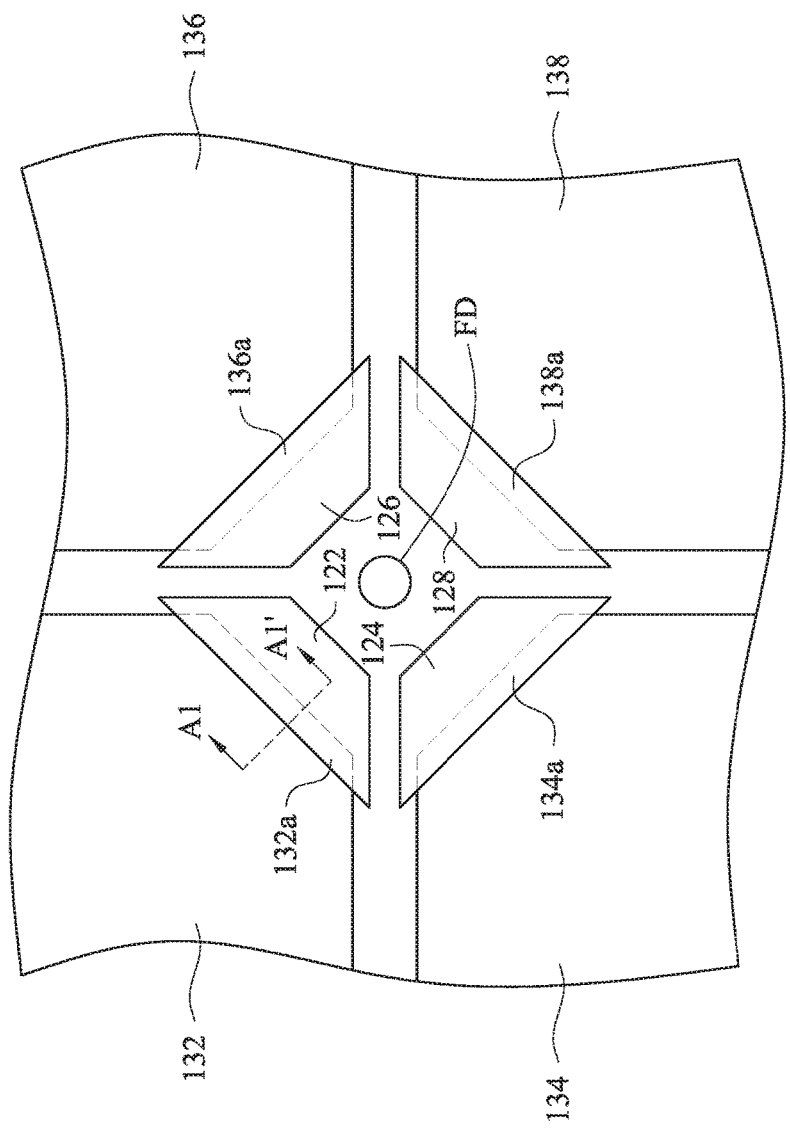
FIG. 1A is a schematic top view of a pixel structure of an image sensor in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

Embodiments of the present disclosure are directed to a pixel structure of an image sensor and fabrication methods of the pixel structure of the image sensor. The pixel structure includes a semiconductor substrate and plural pixel units disposed on the semiconductor substrate. Each of the pixel units includes a light-sensitive region, a protection layer and a transfer gate. The light-sensitive region and the protection layer are disposed on the light-sensitive region, and a terminal portion of the protection layer is covered by the transfer gate. A width of the terminal portion of the protection layer is formed to be progressively decreased along a depthwise direction of the terminal portion of the protection layer, thereby improving image lag, blooming, full well capacity (FWC) and white pixel (WP) of the image sensor. In the fabrication methods of the pixel structure, the protection layer is formed by doping the semiconductor substrate with a tilt angle to enable the width of the terminal portion of the protection layer to be progressively decreased along a depthwise direction of the terminal portion of the protection layer.

Figure 1B:
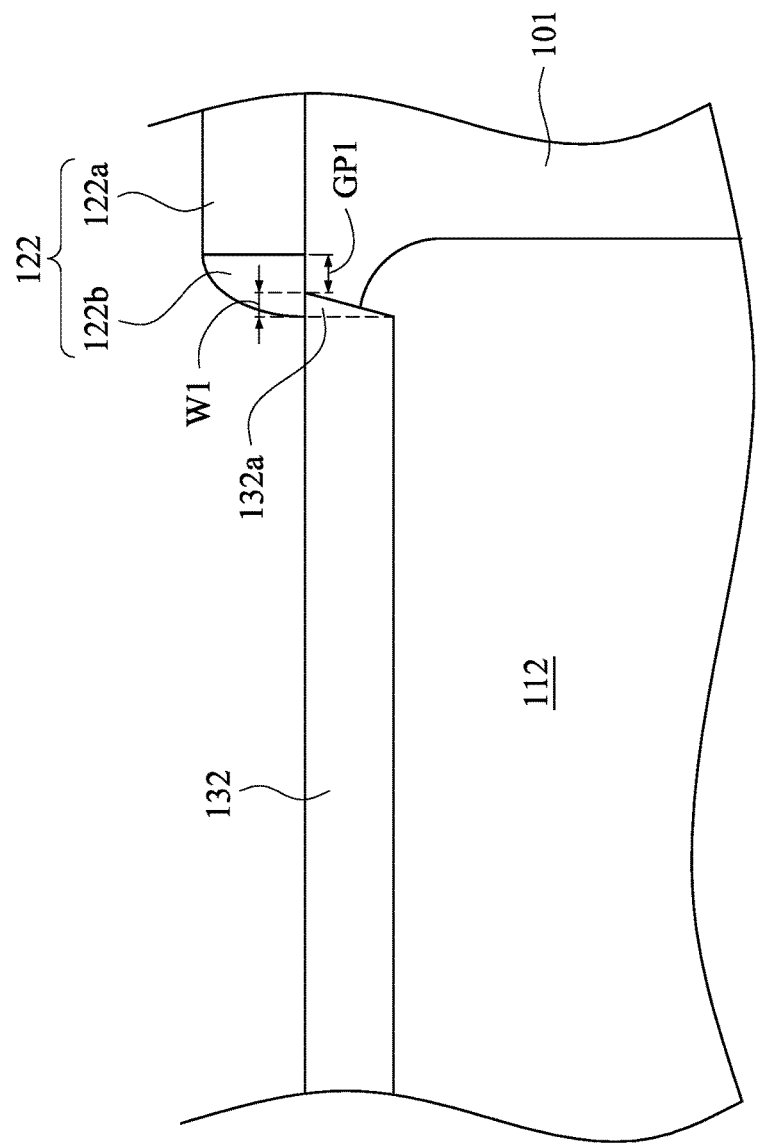
FIG. 1B is a schematic cross-sectional view of the pixel structure along a cutline A1-A1' in FIG. 1A.

Referring to FIG. 1A and FIG. 1B, FIG. 1A is a schematic top view of a pixel structure 100 of an image sensor in accordance with some embodiments of the present disclosure, and FIG. 1B is a schematic cross-sectional view of the pixel structure 100 along a cutline A1-A1' in FIG. 1A. The pixel structure 100 includes a semiconductor substrate 101, plural light-sensitive regions, plural transfer gates 122, 124, 126 and 128, and plural protection layers 132, 134, 136 and 138. The light-sensitive regions and the protection layers 132, 134, 136 and 138 are disposed in the semiconductor substrate 101, and the transfer gates 122, 124, 126 and 128 are disposed on the semiconductor substrate 101.

In some embodiments, the semiconductor substrate 101 may be a semiconductor material and may include structures including a graded layer or a buried oxide, for example. In some exemplary examples, the semiconductor substrate 101 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 101. Alternatively, the semiconductor substrate 101 may be an active layer of a semiconductor-on-insulator (SOI) substrate or a multi-layered structure such as a silicon-germanium layer formed on a bulk silicon layer.

The protection layers 132, 134, 136 and 138 cover the light-sensitive regions in a one-to-one manner. For example, the protection layer 132 covers the light-sensitive region 112 as shown in FIG. 1B. The light-sensitive regions are doped with a dopant of a first type, and the protection layers 132, 134, 136 and 138 are doped with a dopant of a second type different from the first type. In some embodiments, the light-sensitive regions are doped with an n-type dopant, and the protection layers 132, 134, 136 and 138 are doped with a p-type dopant. Therefore, the protection layers 132, 134, 136 and 138 may be referred to as pinning layers corresponding to the light-sensitive regions. In some embodiments, each of the protection layers 132, 134, 136 and 138 is doped with the p-type dopant at a concentration of about 1E13 atoms/cm$^3$.

The transfer gates 122, 124, 126 and 128 are disposed corresponding to the light-sensitive regions to form plural pixel units. For example, the transfer gate 122 is disposed corresponding to the light-sensitive region 112 as shown in FIG. 1B, and thus a pixel unit including the light-sensitive region 112, the transfer gate 122 and the protection layer 132 is formed. In this embodiment, four pixel units are formed and electrically connected to a floating node FD, and the four pixel units are symmetric to the floating node FD. Therefore, the pixel structure 100 is a 4-share pixel structure. In some embodiments, the protection layers 132, 134, 136 and 138 are symmetric to the floating node FD. In some embodiments, isolation structures are formed between the pixel units to separate the pixel units from each other. In some embodiments, the isolation structures are regions doped with a p-type dopant.

Each of the transfer gates 122, 124, 126 and 128 includes gate stacks and spacers disposed on sidewalls of the gate stacks. For example, the transfer gate 122 includes a gate stack 122a and spacers 122b. In some embodiments, each of the gate stacks of the transfer gates 122, 124, 126 and 128 includes a gate dielectric layer and a gate electrode layer disposed on the gate dielectric layer, but embodiments of the present disclosure are not limited thereto.

Each of the protection layers 132, 134, 136 and 138 has a terminal portion 132a, 134a, 136a or 138a covered by a corresponding transfer gate. For example, the transfer gate 122 corresponds to the protection layer 132, and the protection layer 132 includes a terminal portion 132a covered by the transfer gate 122 as shown in FIG. 1B. In some embodiments, the terminal portion 132a of the protection layer 132 is covered by one of the spacers 122b, and the terminal portion 132a of the protection layer 132 does not extend to the gate stack 122a. In other words, a distance GP1 between the terminal portion 132a and the gate stack 122a is greater than zero.

Further, a width of each of the terminal portion of the protection layers 132, 134, 136 and 138 is progressively decreased along a depthwise direction of the terminal portion. For example, a width W1 of the terminal portion 132a of the protection layer 132 is progressively decreased along a depthwise direction of the terminal portion 132a of the protection layer 132.

Because the terminal portion of each of the protection layers 132, 134, 136 and 138 is progressively decreased along the depthwise direction, and does not extend to a gate stack of the corresponding transfer gate, channeling effect of the pixel structure 100 is reduced and image lag, blooming, full well capacity (FWC) and white pixel (WP) of the image sensor can be improved accordingly.

Figure 2A:
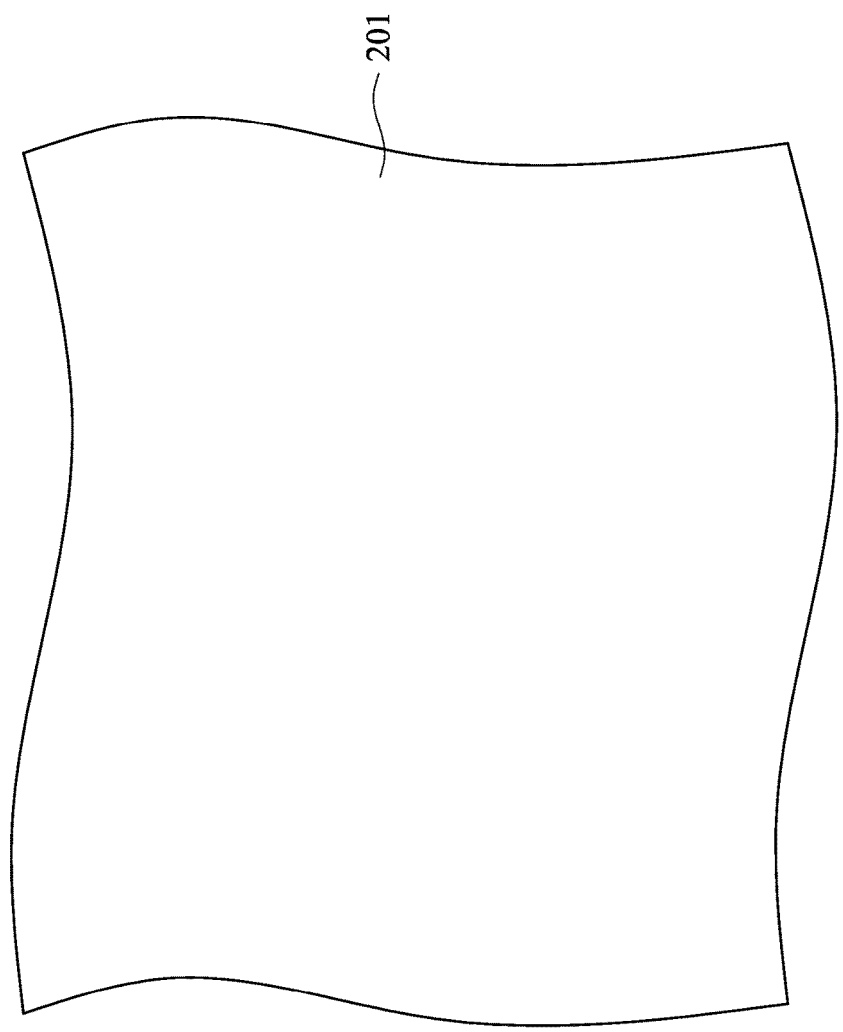
FIG. 2A, FIG. 2B, FIG. 2C, FIG. 2D, FIG. 2E, FIG. 2F, FIG. 2G and FIG. 2H are schematic top views of intermediate stages showing a method for fabricating a pixel structure of an image sensor in accordance with some embodiments of the present disclosure.
Figure 2A:
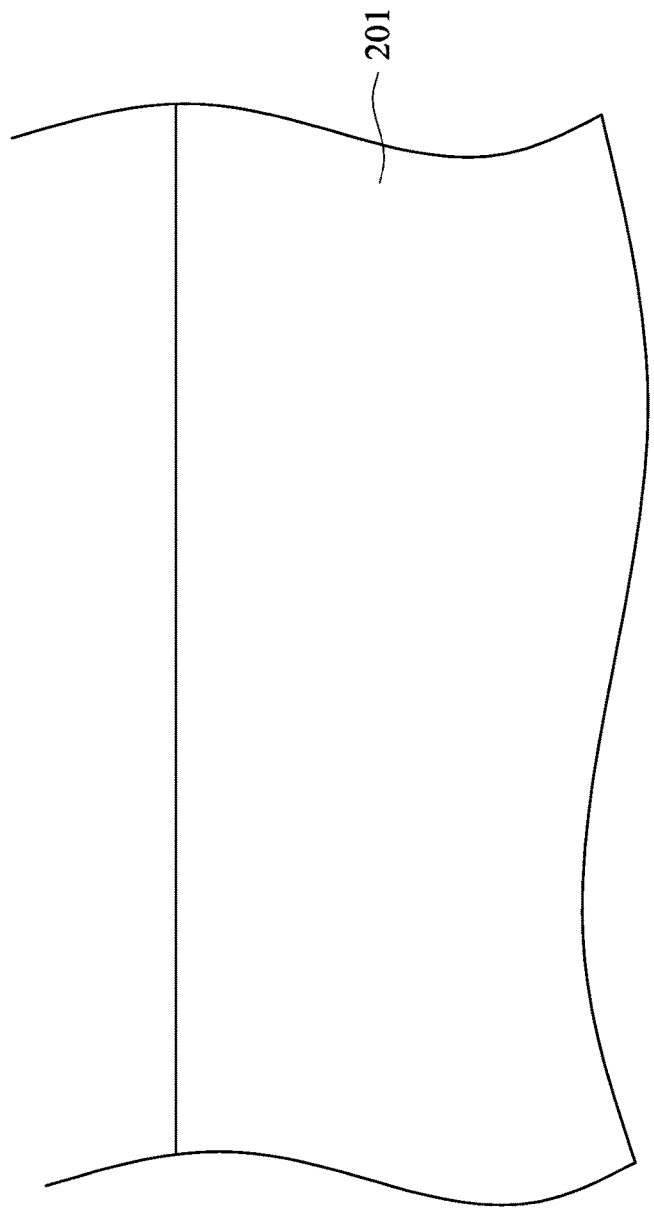
Figure 2B:
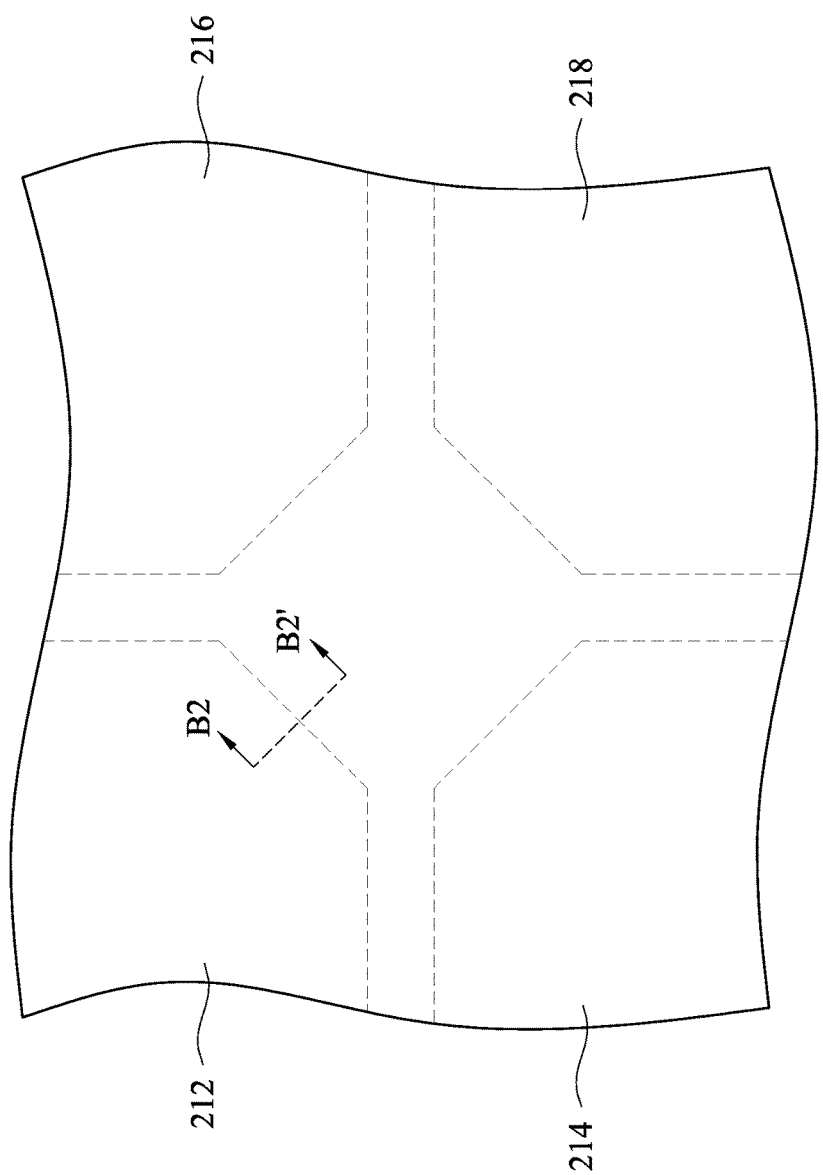
Figure 2B:
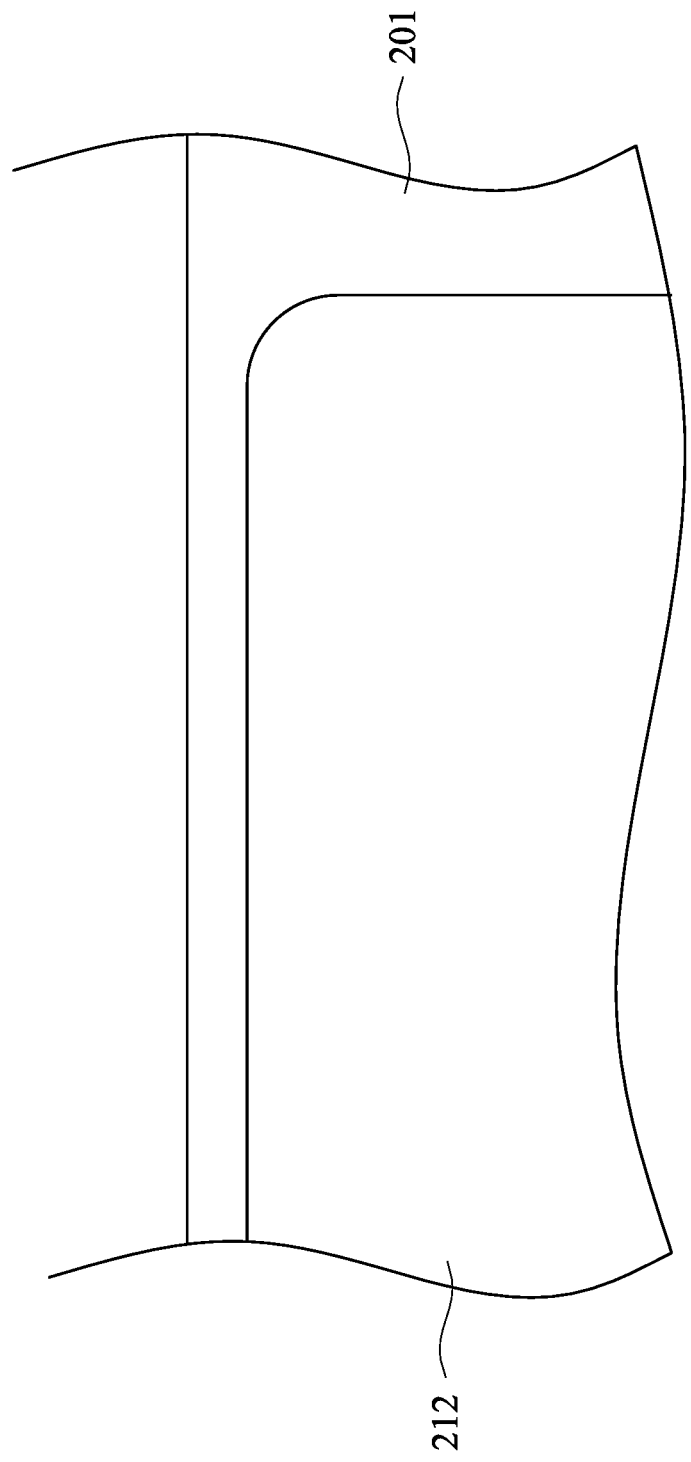
Figure 2C:
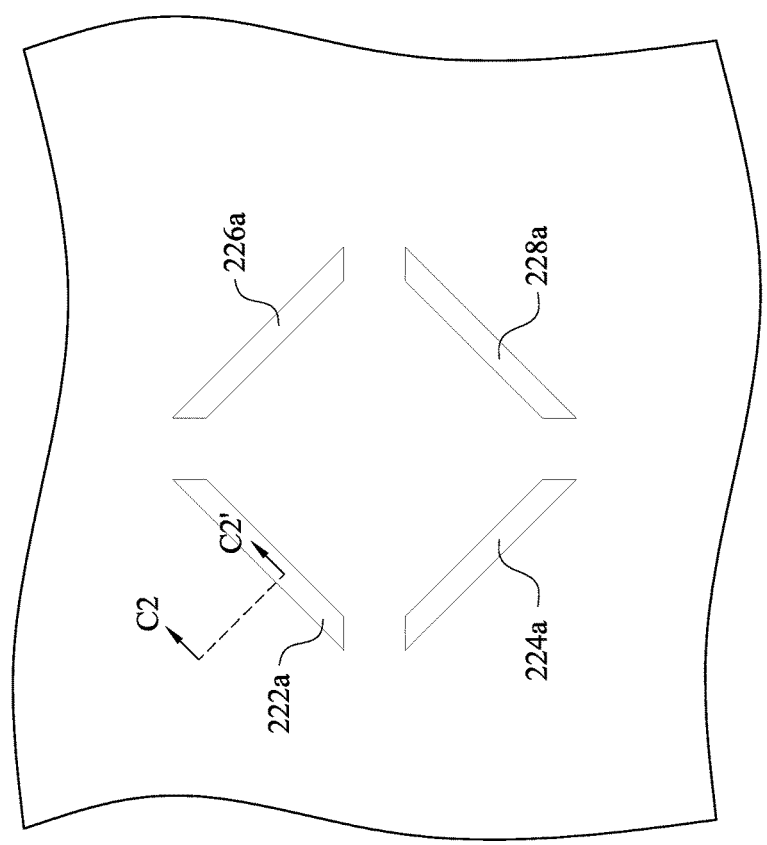
Figure 2C:
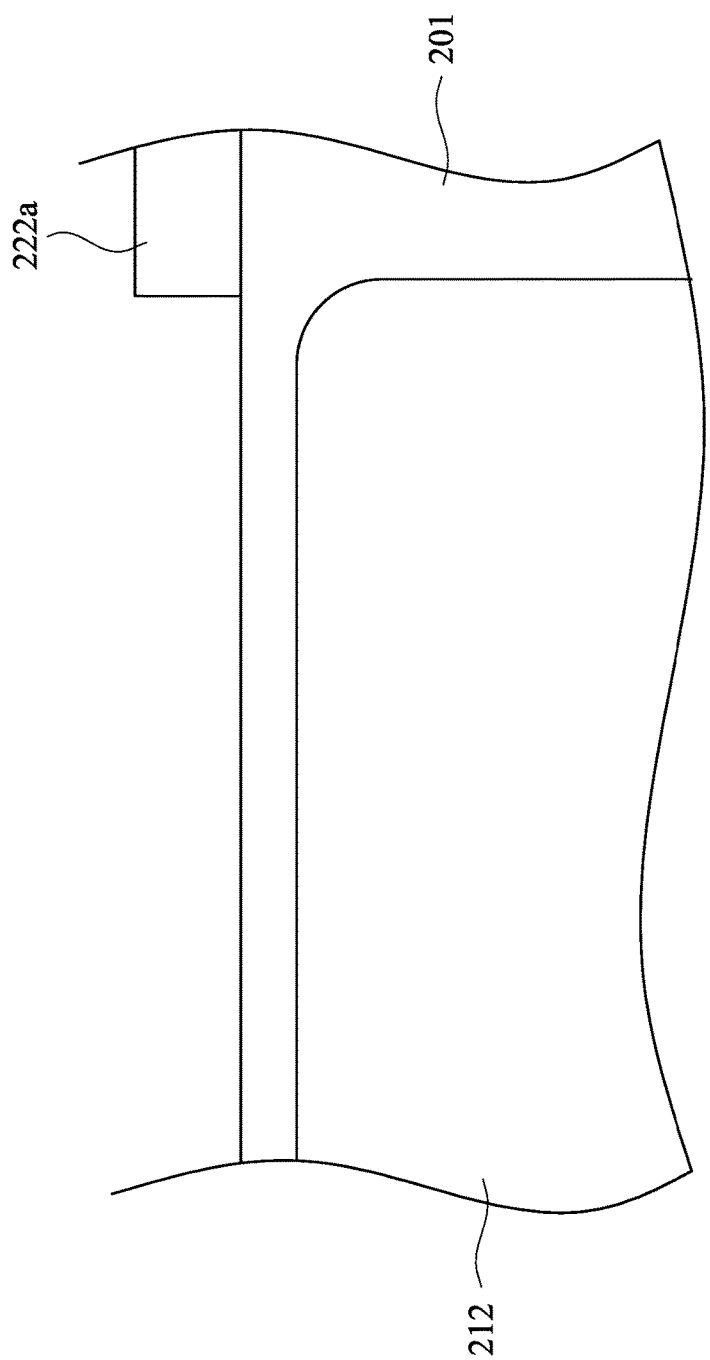
Figure 2D:
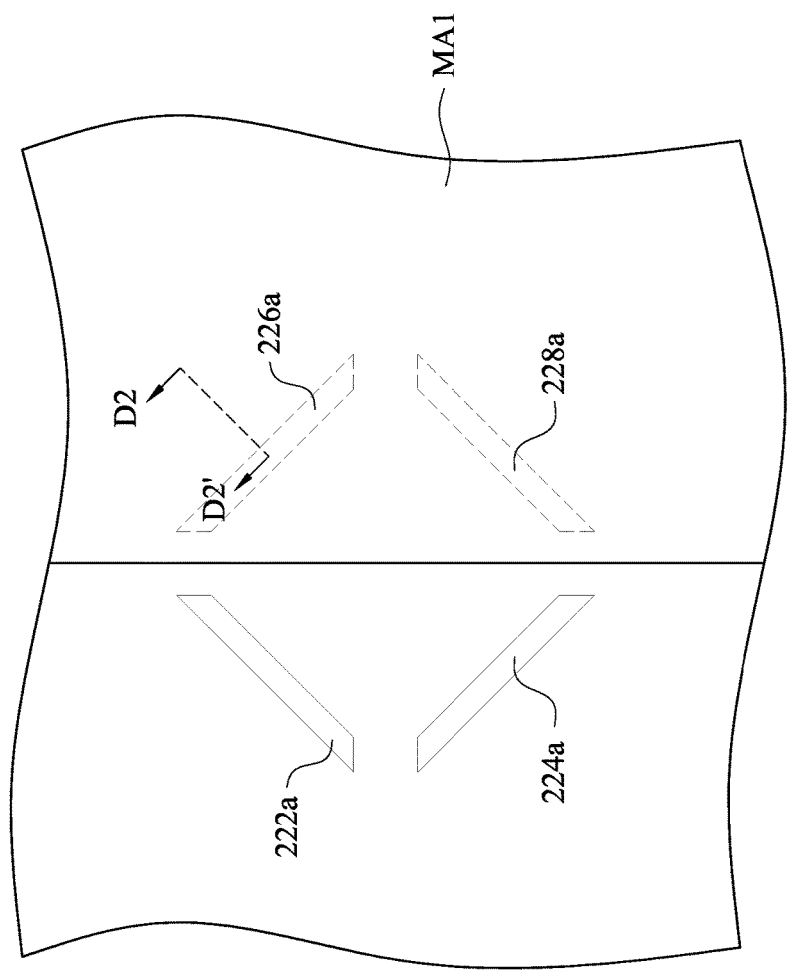
Figure 2D:
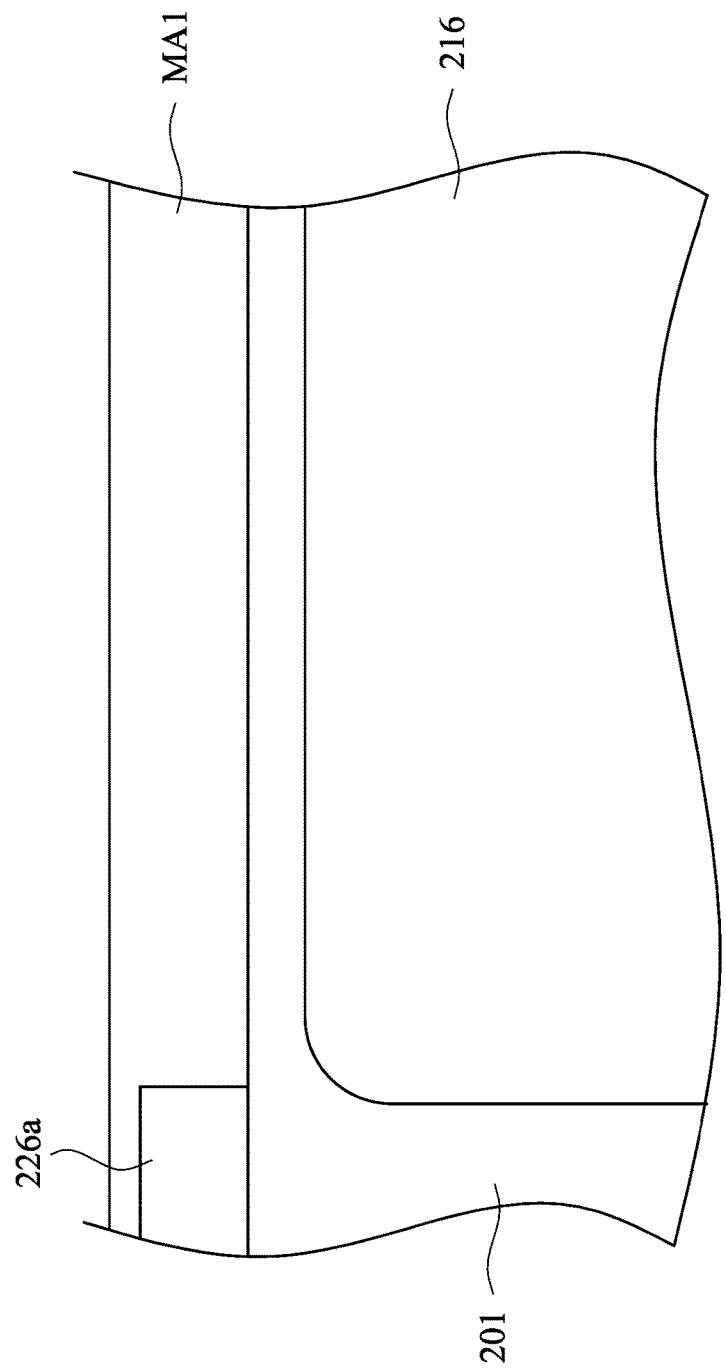
Figure 2E:
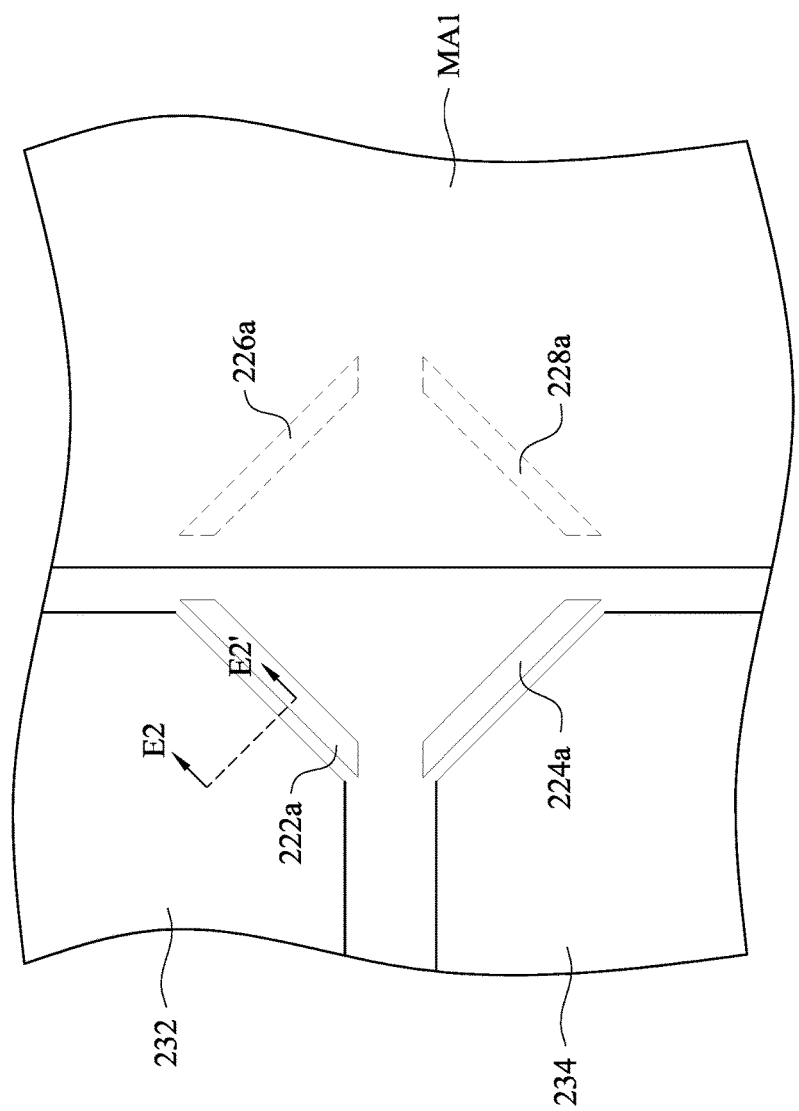
Figure 2E:
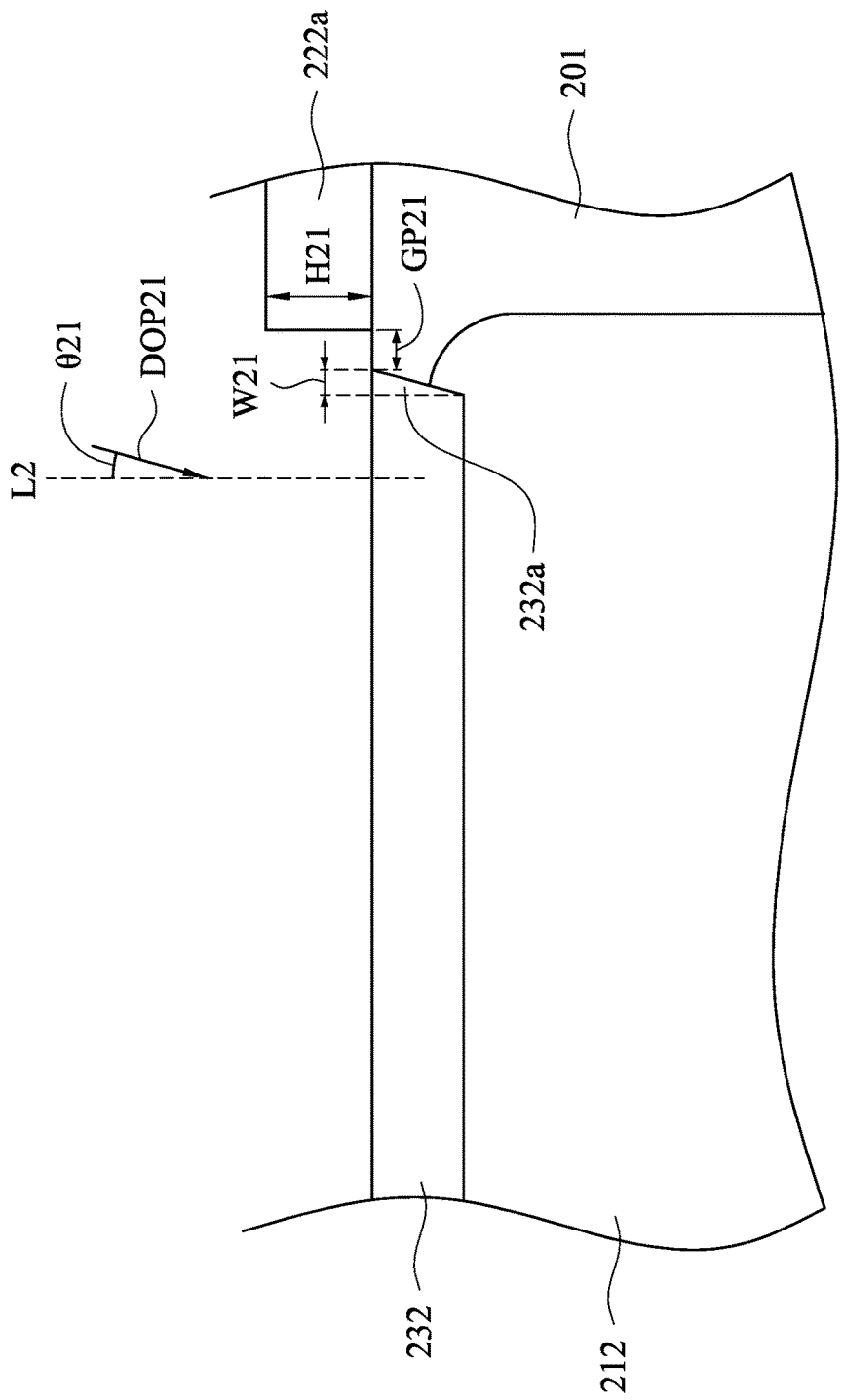
Figure 2F:
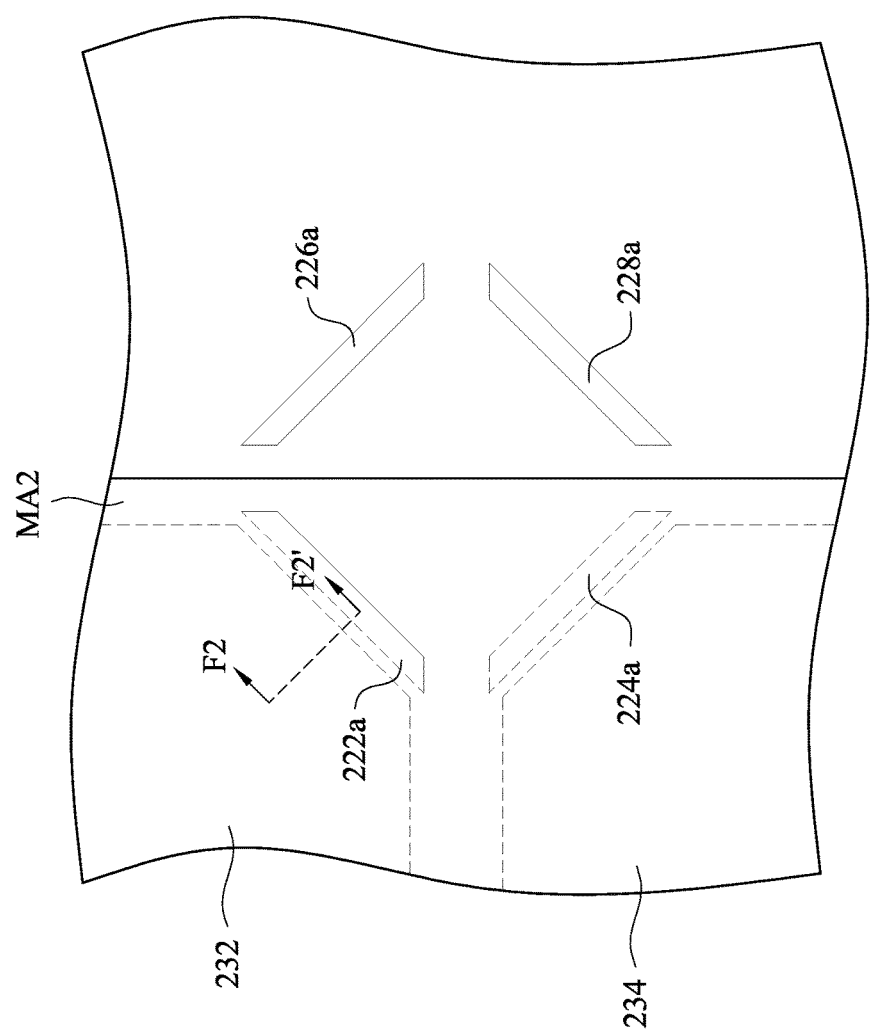
Figure 2F:
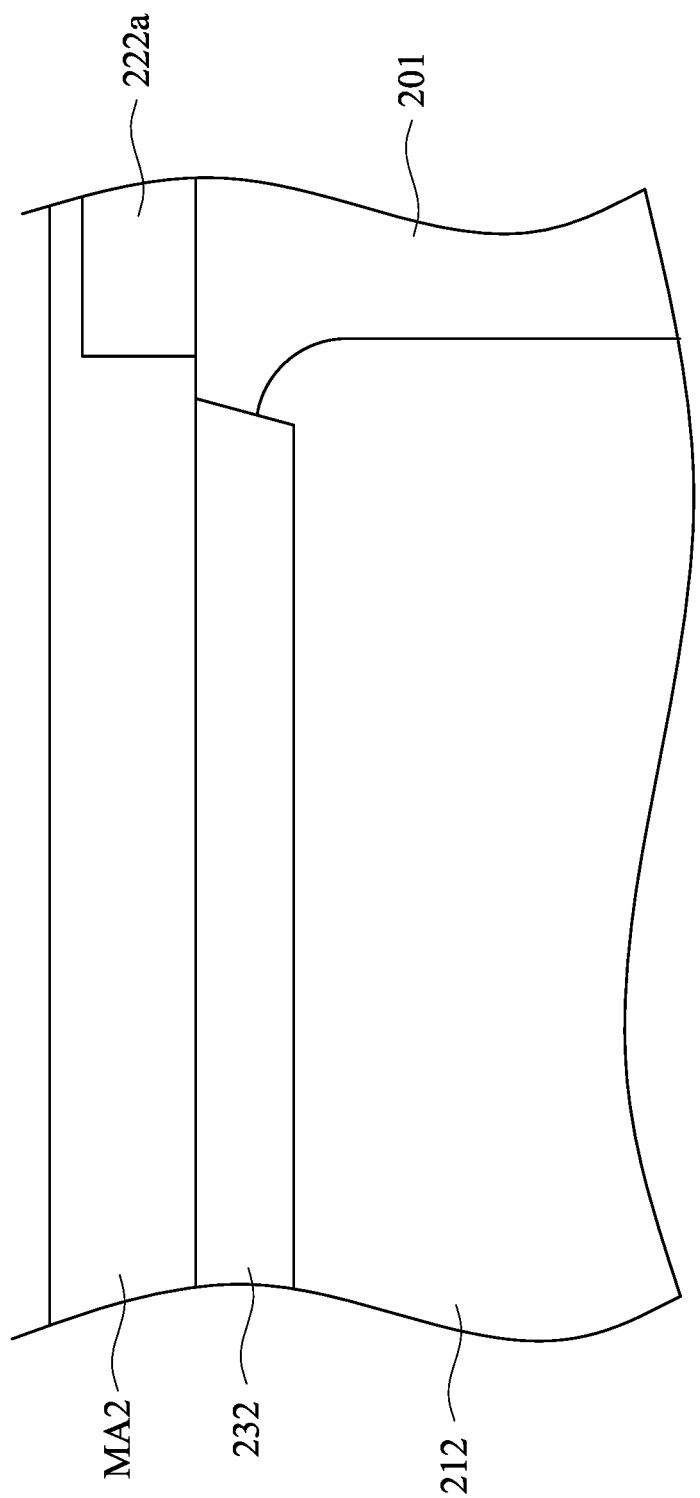
Figure 2G:
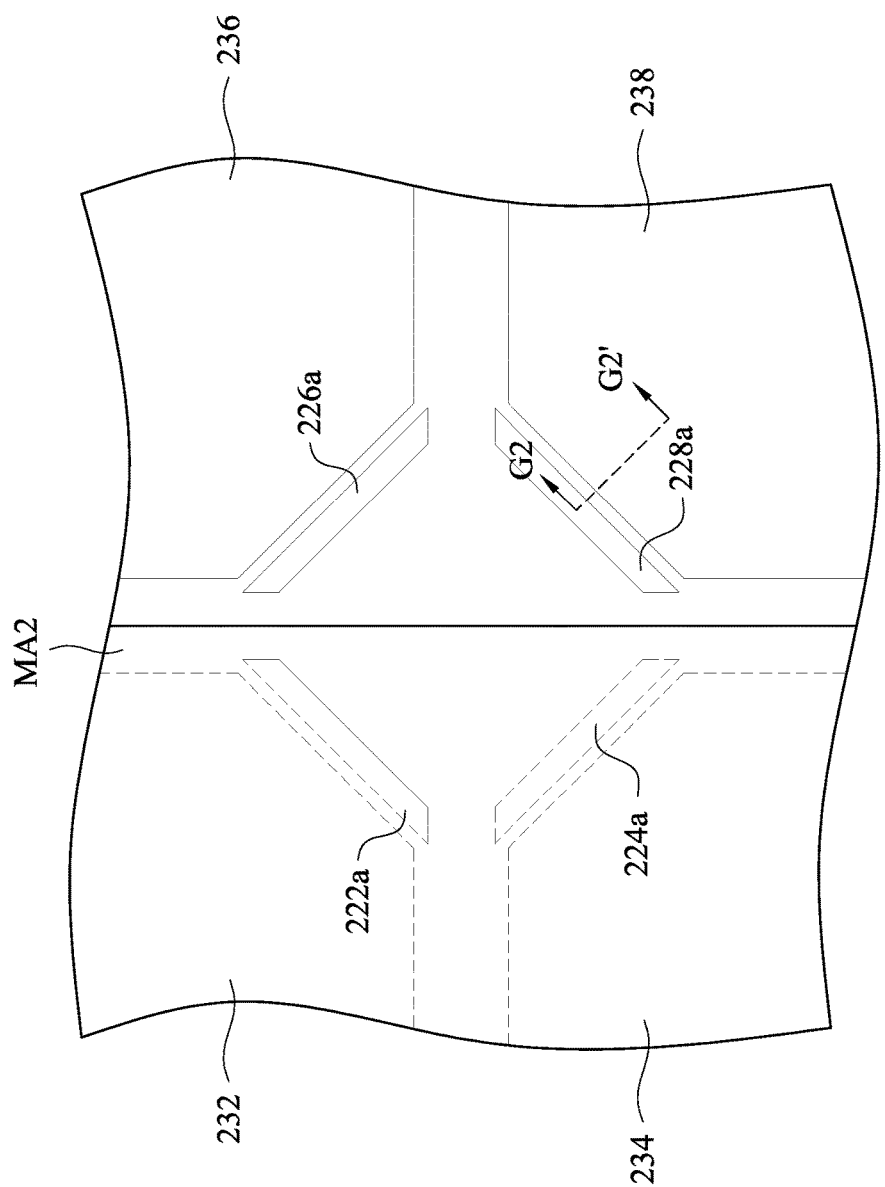
Figure 2G:
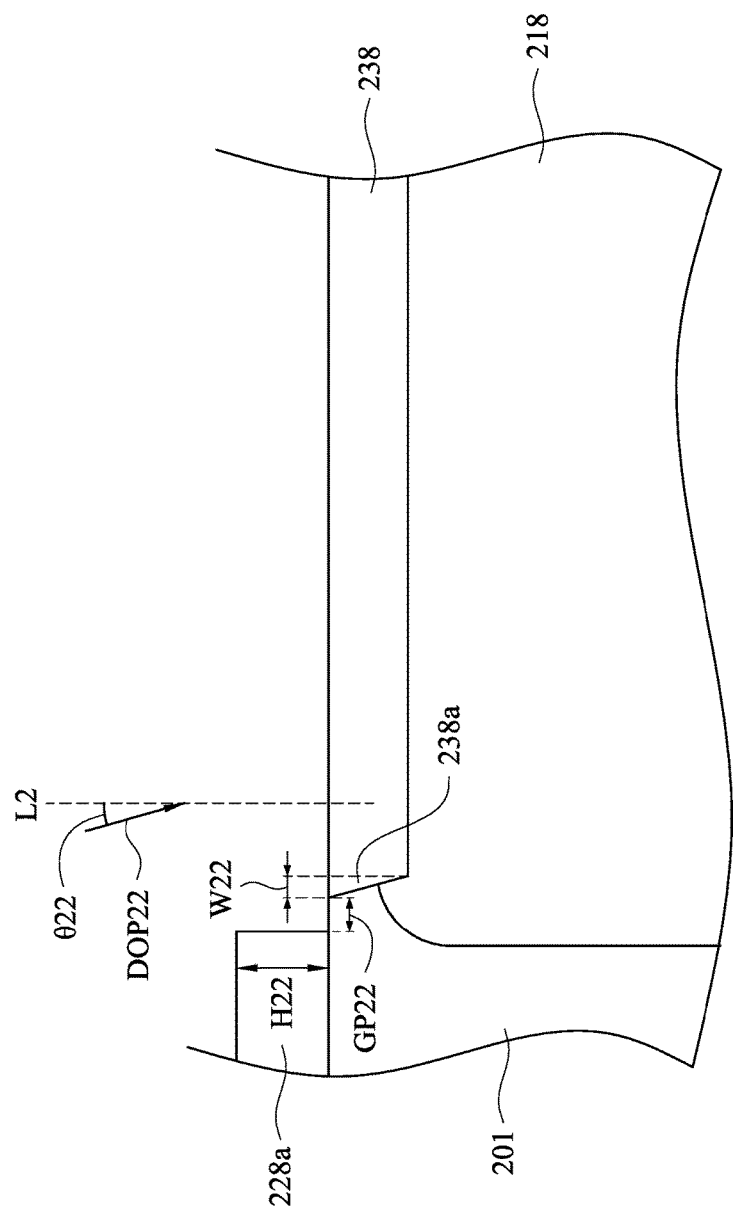
Figure 2H:
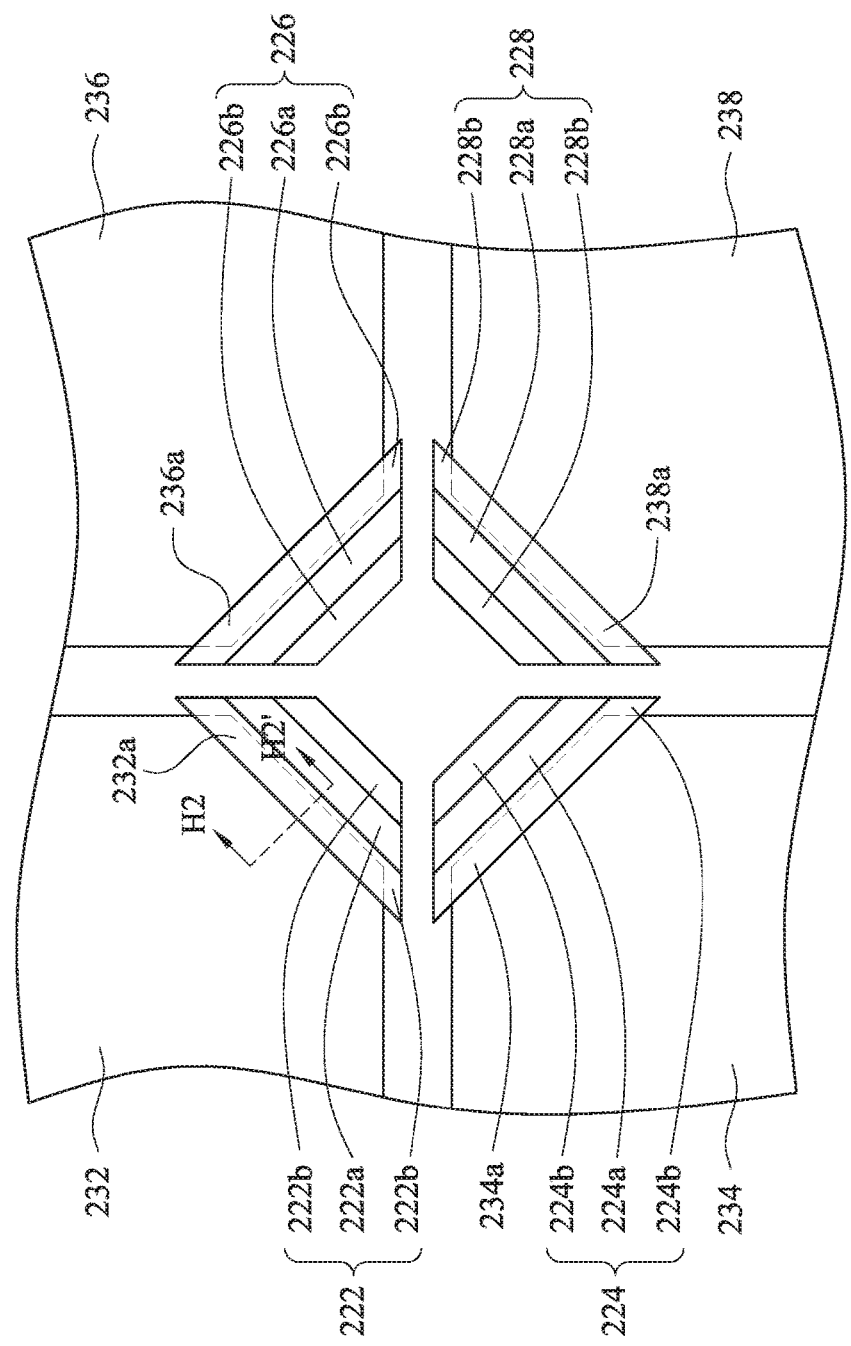
Figure 2H:
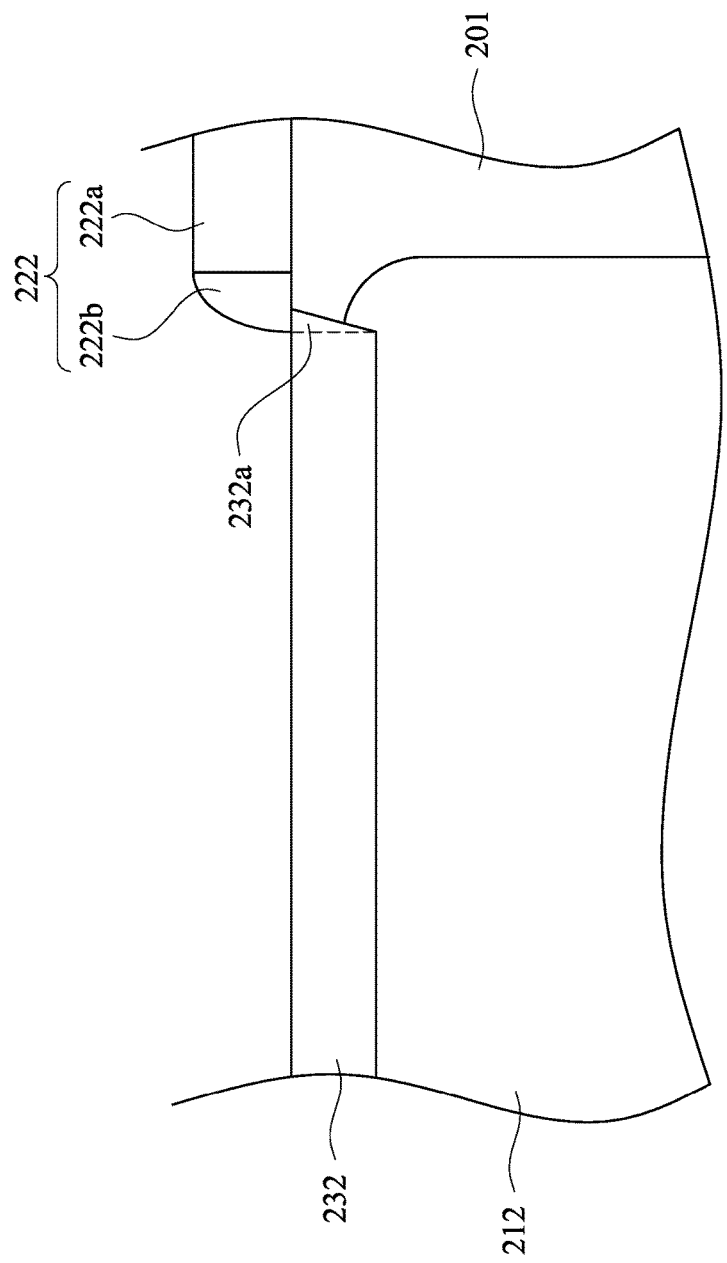

Referring to FIG. 2A to FIG. 2H', FIG. 2A, FIG. 2B, FIG. 2C, FIG. 2D, FIG. 2E, FIG. 2F, FIG. 2G and FIG. 2H are schematic top views of intermediate stages showing a method for fabricating a pixel structure of an image sensor in accordance with some embodiments of the present disclosure, and FIG. 2A', FIG. 2B', FIG. 2C', FIG. 2D', FIG. 2E', FIG. 2F', FIG. 2G' and FIG. 2H' are schematic cross-sectional views of the intermediate stages shown in FIG. 2A, FIG. 2B, FIG. 2C, FIG. 2D, FIG. 2E, FIG. 2F, FIG. 2G and FIG. 2H.

At first, a semiconductor substrate 201 is provided as shown in FIG. 2A and FIG. 2A', in which FIG. 2A' is a schematic cross-sectional view of FIG. 2A. In some embodiments, the semiconductor substrate 201 may be a semiconductor material and may include structures including a graded layer or a buried oxide, for example. In some exemplary examples, the semiconductor substrate 201 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 201. Alternatively, the semiconductor substrate 201 may be an active layer of a semiconductor-on-insulator (SOI) substrate or a multi-layered structure such as a silicon-germanium layer formed on a bulk silicon layer.

Then, light-sensitive regions 212, 214, 216 and 218 are formed in the semiconductor substrate 201 as shown in FIG. 2B and FIG. 2B', in which FIG. 2B' is a schematic cross-sectional view along a cutline B2-B2' in FIG. 2B. The light-sensitive regions 212, 214, 216 and 218 are doped with a dopant of a first type. In some embodiments, the light-sensitive regions 212, 214, 216 and 218 are doped with an n-type dopant, but embodiments of the present disclosure are not limited thereto. In some embodiments, isolation structures are formed between the light-sensitive regions 212, 214, 216 and 218 to separate the light-sensitive regions 212, 214, 216 and 218 from each other. In some embodiments, the isolation structures are regions doped with a p-type dopant.

Thereafter, plural gate stacks 222a, 224a, 226a and 228a are formed corresponding to the light-sensitive regions 212, 214, 216 and 218 as shown in FIG. 2C and FIG. 2C', in which FIG. 2C' is a schematic cross-sectional view along a cutline C2-C2' in FIG. 2C. For example, the gate stack 222a is formed corresponding to the light-sensitive region 212. For another example, the gate stack 224a is formed corresponding to the light-sensitive region 214. For further another example, the gate stack 226a is formed corresponding to the light-sensitive region 216. For still another example, the gate stack 228a is formed corresponding to the light-sensitive region 218. In some embodiments, each of the gate stacks 222a, 224a, 226a and 228a includes a gate dielectric layer and a gate electrode layer disposed on the gate dielectric layer, but embodiments of the present disclosure are not limited thereto.

Then, a mask MA1 is formed to cover the light-sensitive regions 216 and 218 as shown in FIG. 2D and FIG. 2D', in which FIG. 2D' is a schematic cross-sectional view along a cutline D2-D2' in FIG. 2D. In some embodiments, the gate stack 226a and the gate stack 228a is also covered by the mask MA1.

Thereafter, a doping process is performed on the semiconductor substrate 201 to form a protection layer 232 and a protection layer 234 as shown in FIG. 2E and FIG. 2E', in which FIG. 2E' is a schematic cross-sectional view along a cutline E2-E2' in FIG. 2E. The protection layer 232 is formed on the light-sensitive regions 212 and covers the light-sensitive regions 212. The protection layer 234 is formed on the light-sensitive regions 214 and covers the light-sensitive regions 214. In some embodiments, the protection layers 232 and 234 are formed by doping the semiconductor substrate 201 with a dopant of a second type different from the first type. In some embodiments, the protection layers 232 and 234 are formed by doping with a p-type dopant. Therefore, the protection layers 232 and 234 may be referred to as pinning layers corresponding to the light-sensitive regions 212 and 214.

The doping process used to form the protection layers 232 and 234 is performed with a tilt angle $\theta 21$ as shown in FIG. 2E'. For example, a normal L2 perpendicular to a surface of the semiconductor substrate 201 is defined, and the doping process is performed along a doping direction DOP21 tilting toward the gate stack 222a. Therefore, the tilt angle $\theta 21$ included between the doping direction DOP21 and the normal L2 is greater than zero.

Because the doping process is performed with the tilt angle $\theta 21$, each of terminal portions of the protection layers 232 and 234 is formed to have a width progressively decreased along a depthwise direction, and the terminal portions of the protection layers 232 and 234 do not extend to corresponding gate stacks. For example, as shown in FIG. 2E', the protection layer 232 has a terminal portion 232a. A width W21 of the terminal portion 232a is progressively decreased along a depthwise direction of the terminal portion 232a of the protection layer 232. Further, a distance GP21 between the terminal portion 232a and the gate stack 222a is greater than zero. In some embodiments, the distance GP21 is equal to H21*tan ($\theta 21$), in which H21 is a height of the gate stack 222a.

Then, the mask MA1 is removed and a mask MA2 is formed to cover the protection layers 232 and 234 as shown in FIG. 2F and FIG. 2F', in which FIG. 2F' is a schematic cross-sectional view along a cutline F2-F2' in FIG. 2F. In some embodiments, the gate stacks 222a and 224a are also covered by the mask MA2.

Thereafter, a doping process is performed on the semiconductor substrate 201 to form a protection layer 236 and a protection layer 238 as shown in FIG. 2G and FIG. 2G', in which FIG. 2G' is a schematic cross-sectional view along a cutline G2-G2' in FIG. 2G. The protection layer 236 is formed on the light-sensitive regions 216 and covers the light-sensitive regions 216. The protection layer 238 is formed on the light-sensitive regions 218 and covers the light-sensitive regions 218. In some embodiments, the protection layers 236 and 238 are formed by doping the semiconductor substrate 201 with a dopant of a second type different from the first type. In some embodiments, the protection layers 236 and 238 are formed by doping with a p-type dopant. Therefore, the protection layers 236 and 238 may be referred to as pinning layers corresponding to the light-sensitive regions 216 and 218.

The doping process used to form the protection layers 236 and 238 are performed with a tilt angle $\theta 22$ as shown in FIG. 2G'. For example, the doping process is performed along a doping direction DOP22 tilting toward the gate stack 228a. Therefore, the tilt angle $\theta 22$ included between the doping direction DOP22 and the normal L2 is greater than zero.

Because the doping process is performed with a tilt angle $\theta 22$, each of terminal portions of the protection layers 236 and 238 are formed to have a width progressively decreased along a depthwise direction, and the terminal portions of the protection layers 236 and 238 do not extend to corresponding gate stacks. For example, as shown in FIG. 2G', the protection layers 238 has a terminal portion 238a. A width W22 of the terminal portion 238a is progressively decreased along a depthwise direction of the terminal portion 238a of the protection layer 238. Further, a distance GP22 between the terminal portion 238a and the gate stack 228a is greater than zero. In some embodiments, the distance GP22 is equal to H22*tan ($\theta 22$), in which H22 is a height of the gate stack 228a.

Then, spacers 222b, 224b, 226b and 228b are formed on sidewalls of the gate stack 222a, 224a, 226a and 228a to form transfer gates 222, 224, 226 and 228, as shown in FIG. 2H and FIG. 2H', in which FIG. 2H' is a schematic cross-sectional view along a cutline H2-H2' in FIG. 2H. In some embodiments, one of the spacers 222b covers the terminal portion 232a of the protection layer 232; one of the spacers 224b covers the terminal portion 234a of the protection layer 234; one of the spacers 226b covers the terminal portion 236a of the protection layer 236; one of the spacers 228b covers the terminal portion 238a of the protection layer 238. Therefore, four pixel units are formed on the semiconductor substrate 201, in which the four pixel units share a floating node (not shown).

Because the terminal portion of each of the protection layers 232, 234, 236 and 238 is progressively decreased along the depthwise direction, and does not extend to a gate stack of the corresponding transfer gate, channeling effect is reduced and image lag, blooming, full well capacity (FWC) and white pixel (WP) of the image sensor can be improved accordingly.

Figure 3:
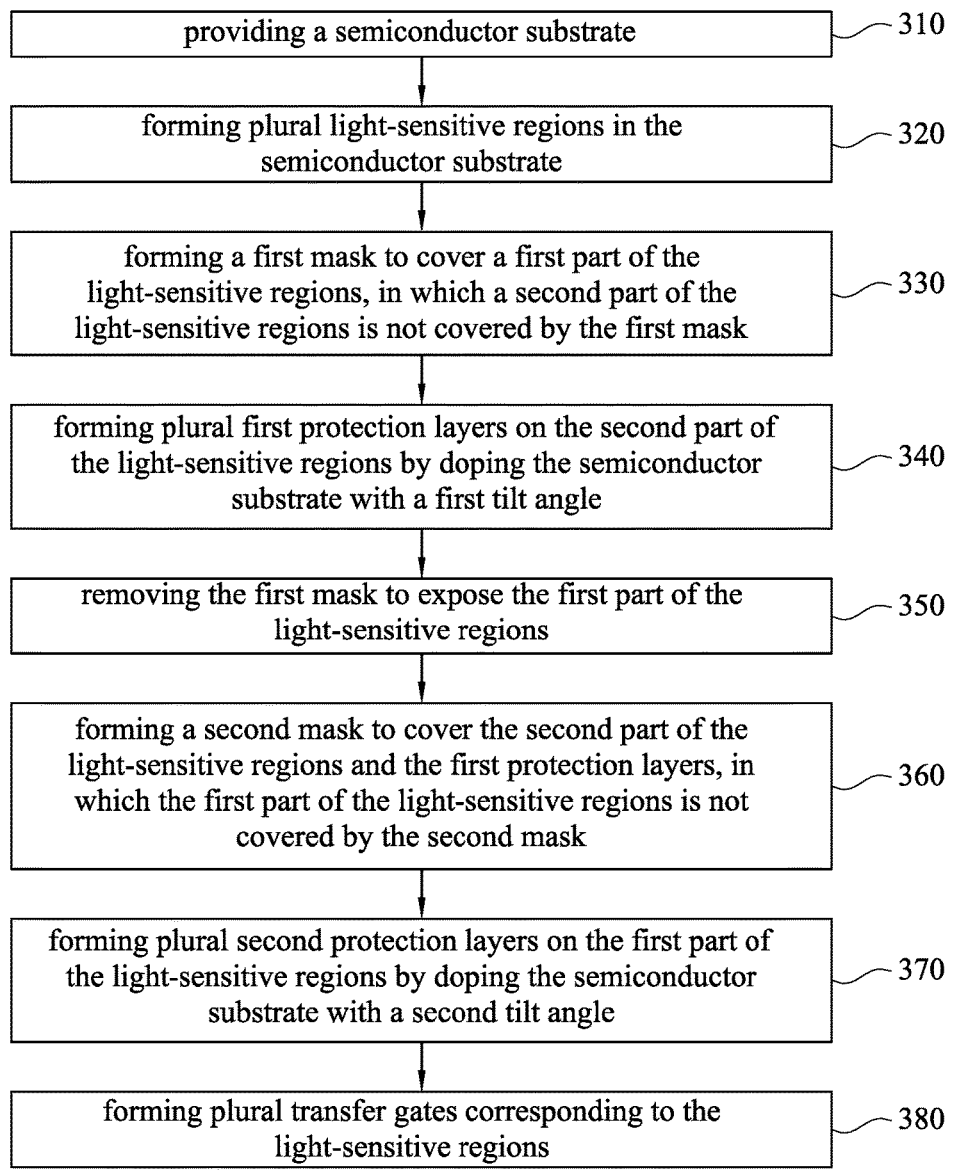
FIG. 3 is a flow chart showing a method for fabricating a pixel structure in accordance with embodiments of the present disclosure.

Referring to FIG. 3, FIG. 3 is a flow chart showing a method 300 for fabricating a pixel structure in accordance with embodiments of the present disclosure. The method 300 begins at operation 310. Operation 310 is performed to provide the semiconductor substrate 201 as shown in FIG. 2A and FIG. 2A'.

Then, operation 320 is performed to form plural light-sensitive regions 212, 214, 216 and 218 in the semiconductor substrate 201 as shown in FIG. 2B and FIG. 2B'. Operation 320 can be performed by using ion implantation, but embodiments of the present disclosure are not limited thereto.

Thereafter, operation 330 is performed to form a first mask MA1 to cover a first part of the light-sensitive regions, such as the light-sensitive regions 216 and 218, as shown in FIG. 2D and FIG. 2D'. Further, a second part of the light-sensitive regions, such as the light-sensitive regions 212 and 214, is not covered by the first mask MA1. In some embodiments, the gate stacks 222a, 224a, 226a and 228a can be formed before operation 330, as shown in FIG. 2C and FIG. 2C'.

Then, operation 340 is performed to form plural first protection layers 232 and 234 on the second part of the light-sensitive regions by doping the semiconductor substrate 201 with a first tilt angle $\theta 21$, as shown in FIG. 2E and FIG. 2E'. Operation 340 can be performed by using ion implantation, but embodiments of the present disclosure are not limited thereto.

Thereafter, operation 350 is performed to remove the first mask MA1 to expose the first part of the light-sensitive regions, and operation 360 is then performed to form a second mask MA2 to cover the second part of the light-sensitive regions and the first protection layers 232 and 234, in which the first part of the light-sensitive regions is not covered by the second masks MA2, as shown in FIG. 2F and FIG. 2F'.

Then, operation 370 is performed to form plural second protection layers 236 and 238 on the first part of the light-sensitive regions by doping the semiconductor substrate 201 with a second tilt angle θ22, as shown in FIG. 2G and FIG. 2G'. Operation 370 can be performed by using ion implantation, but embodiments of the present disclosure are not limited thereto. In some embodiments, the first tilt angle θ21 and the second tilt angle θ22 are greater than 0 degree. In other embodiments, the first tilt angle θ21 is the same as the second tilt angle θ22.

Thereafter, operation 380 is performed to form plural transfer gates 222, 224, 226 and 228 corresponding to the light-sensitive regions 212, 214, 216 and 218, respectively, as shown in FIG. 2H and FIG. 2H'.

Figure 4A:
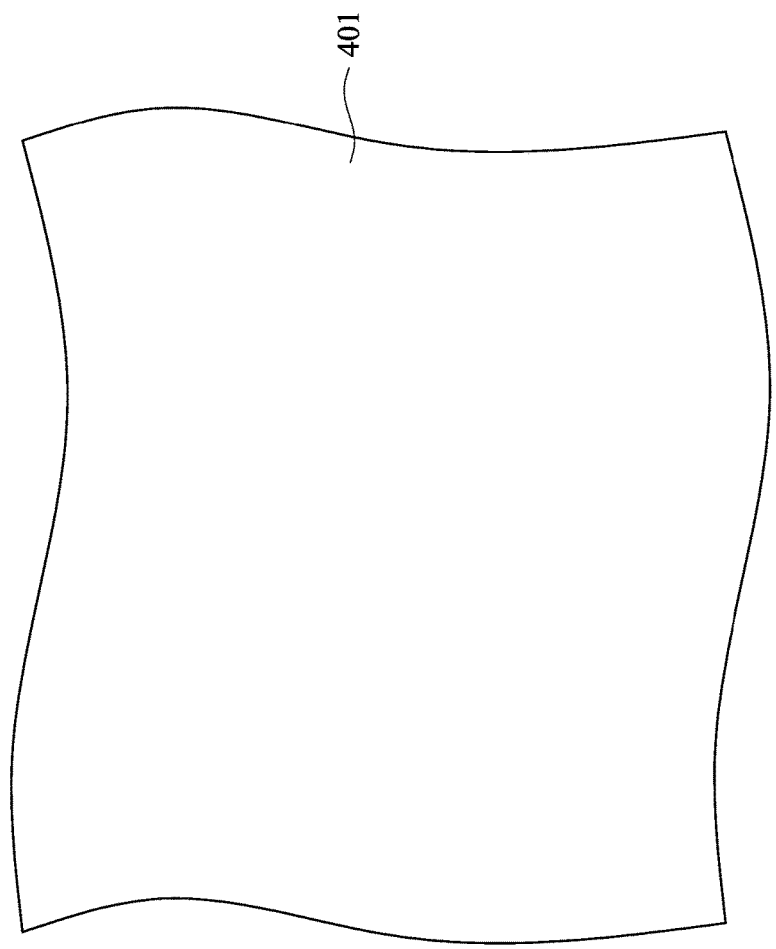
FIG. 4A, FIG. 4B, FIG. 4C, FIG. 4D, FIG. 4E, FIG. 4F and FIG. 4G are schematic top views of intermediate stages showing a method for fabricating a pixel structure of an image sensor in accordance with some embodiments of the present disclosure.
Figure 4A:
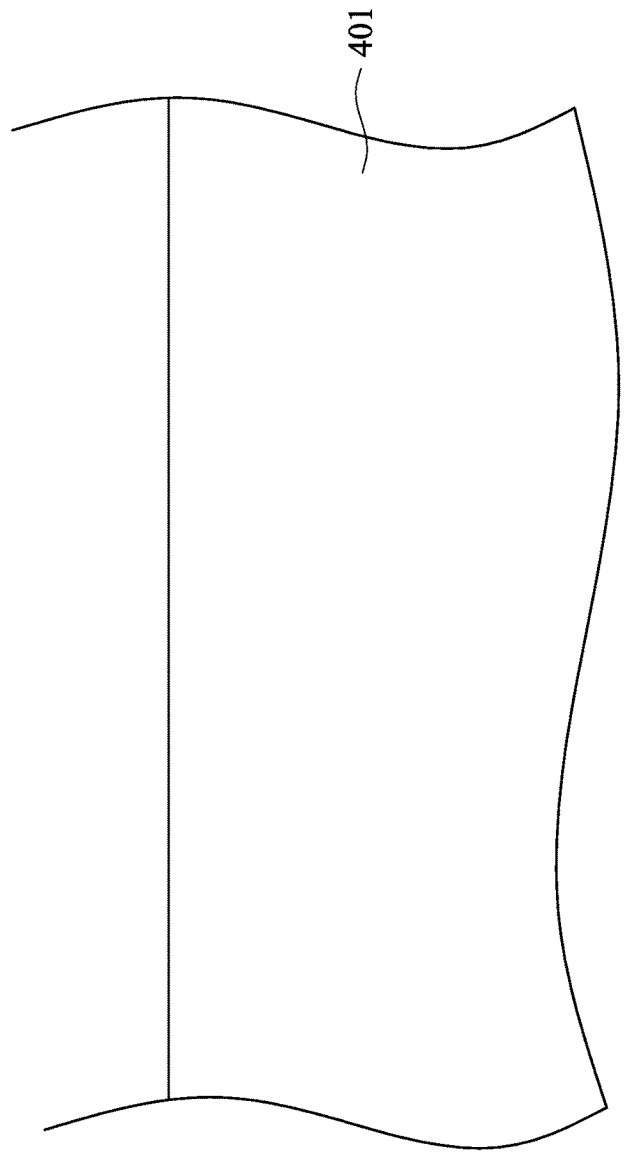
Figure 4B:
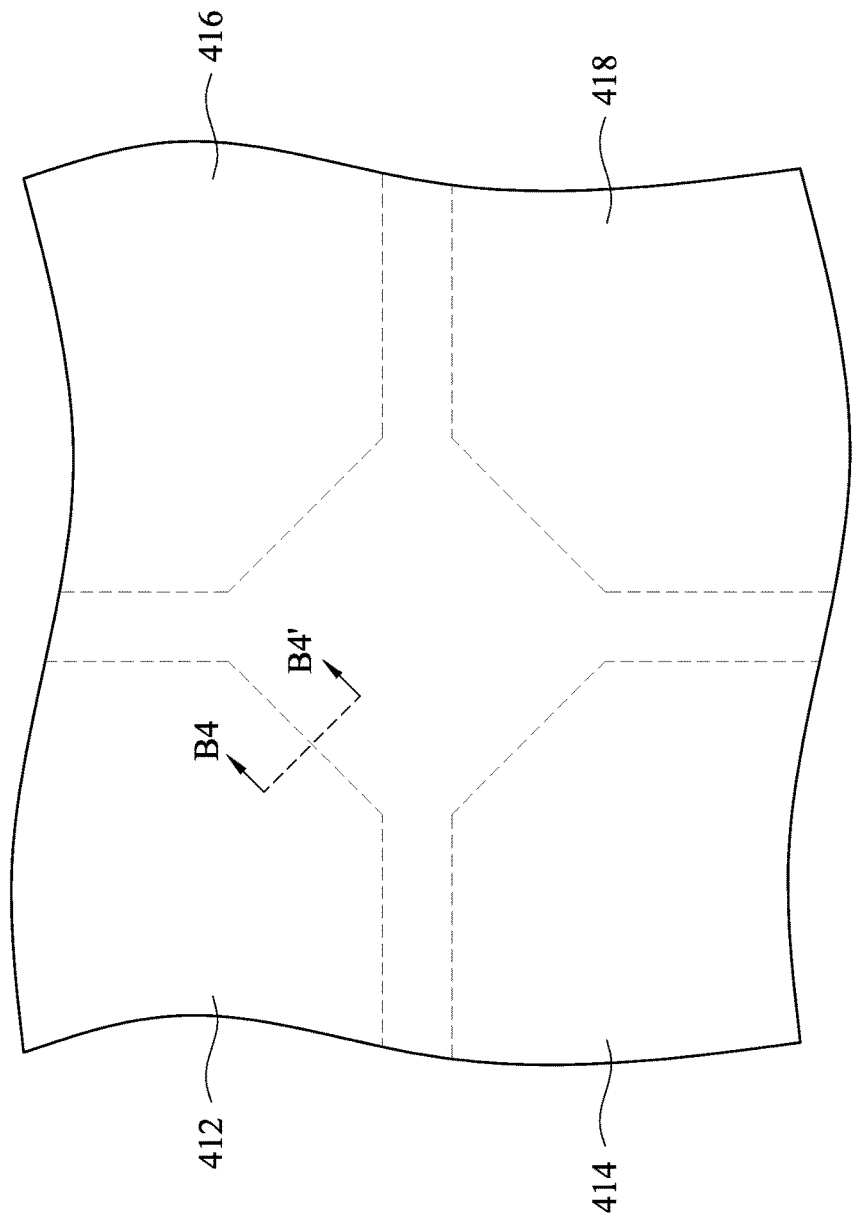
Figure 4B:
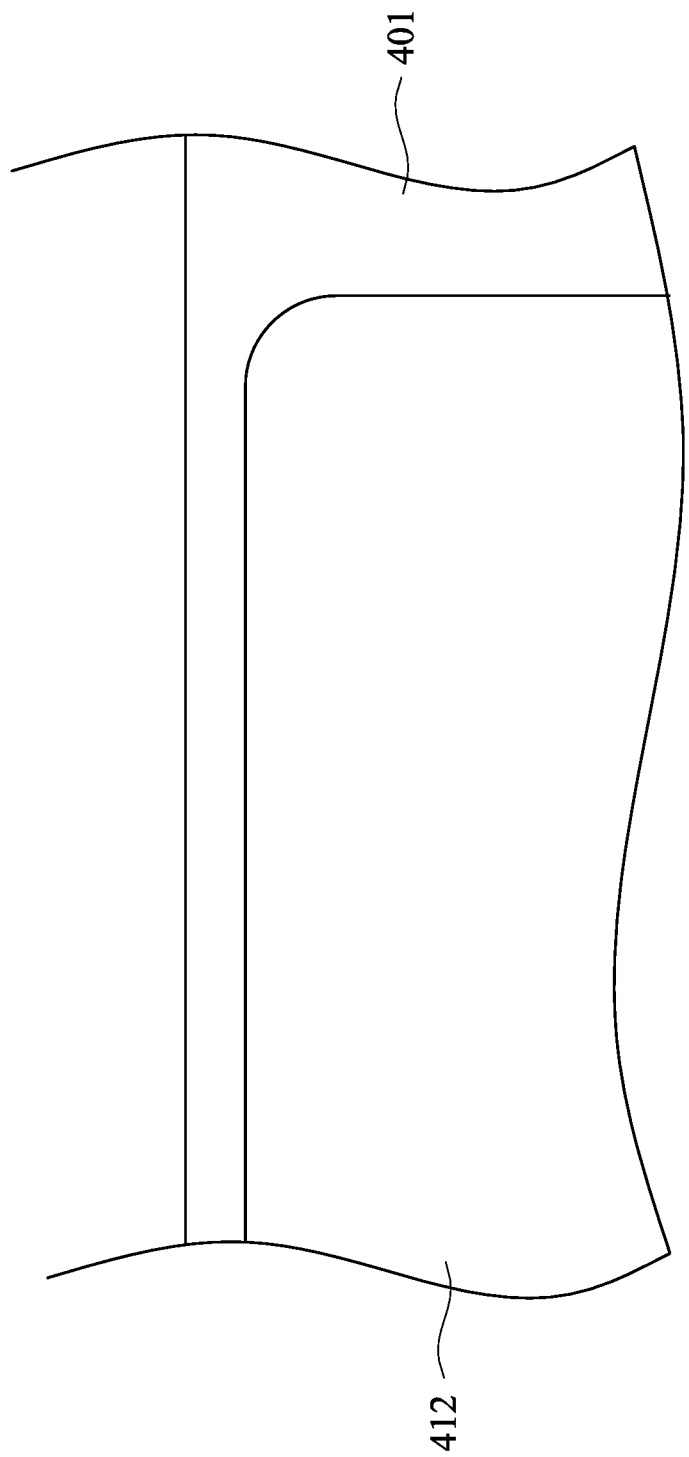
Figure 4C:
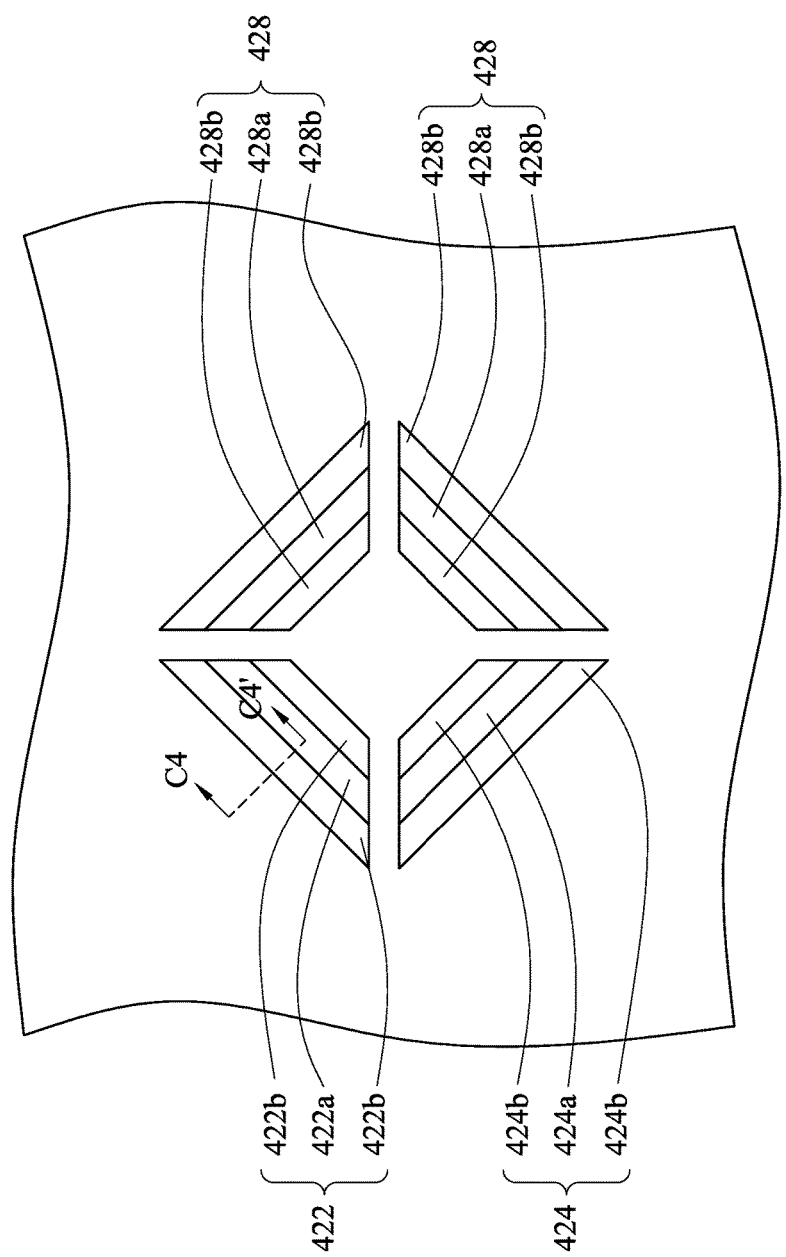
Figure 4C:
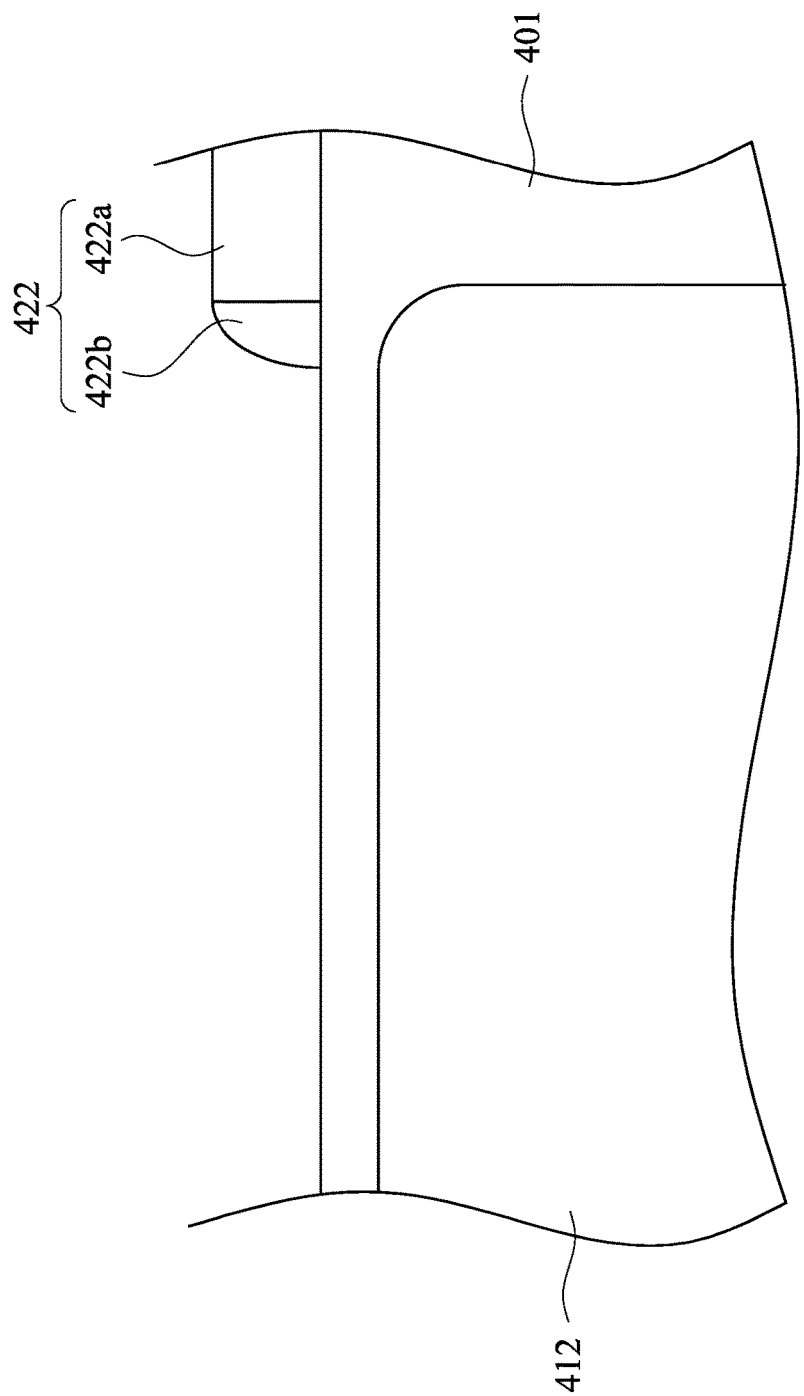
Figure 4D:
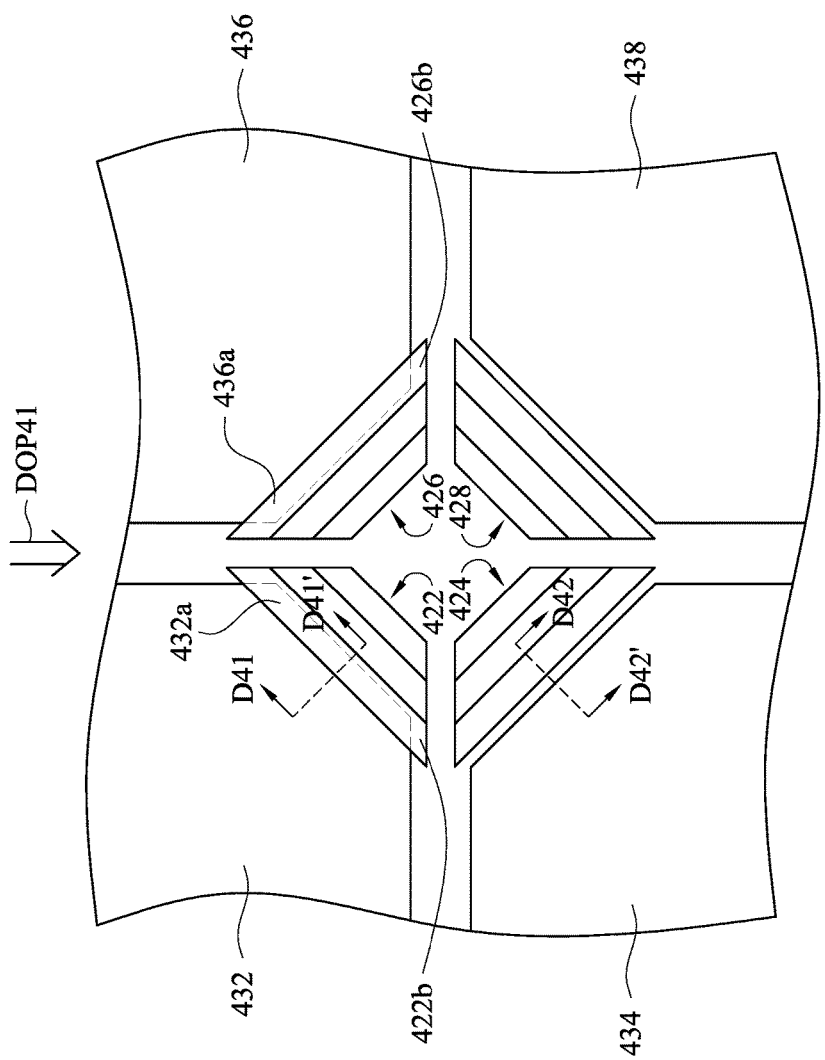
Figure 4D:
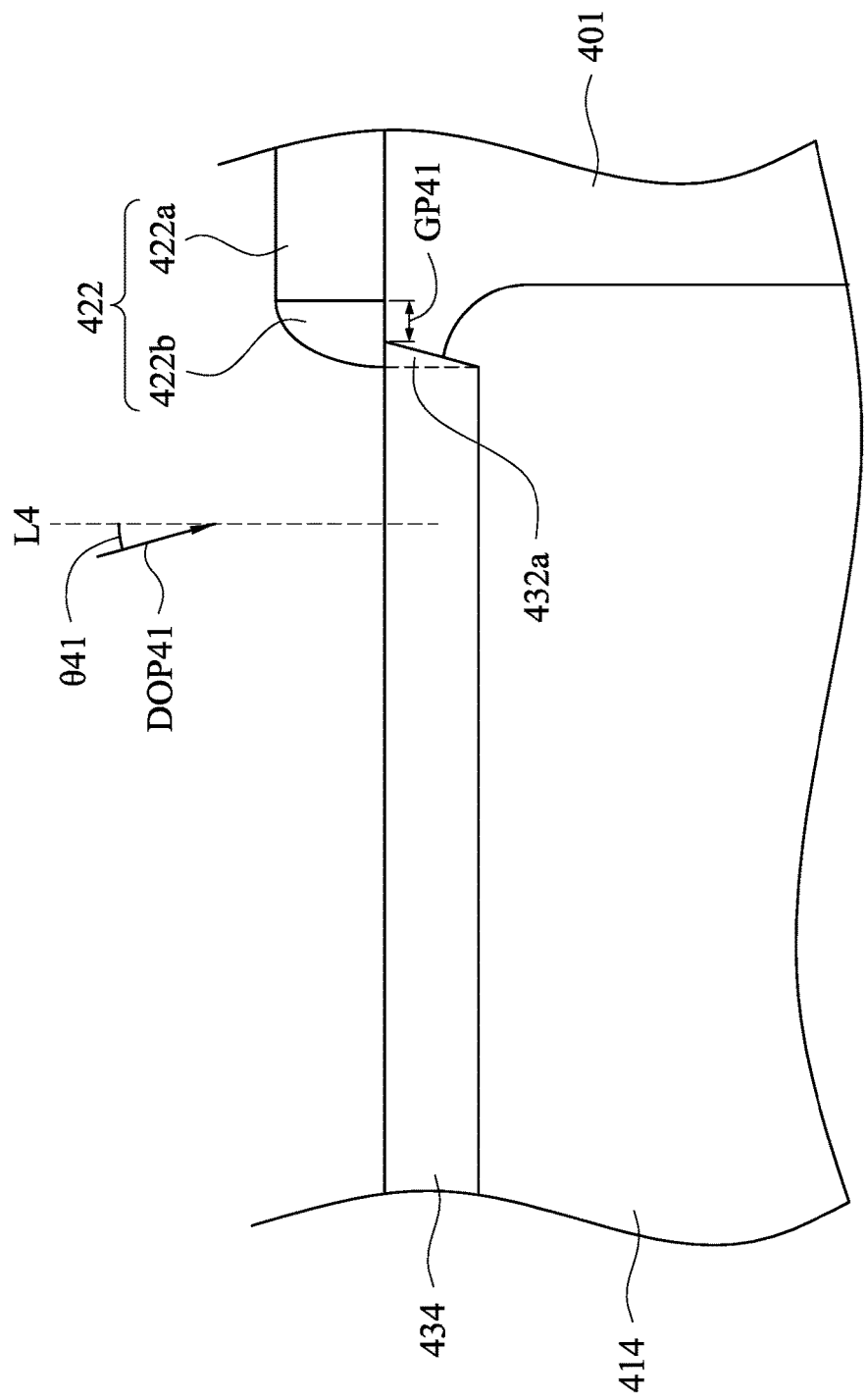
Figure 4E:
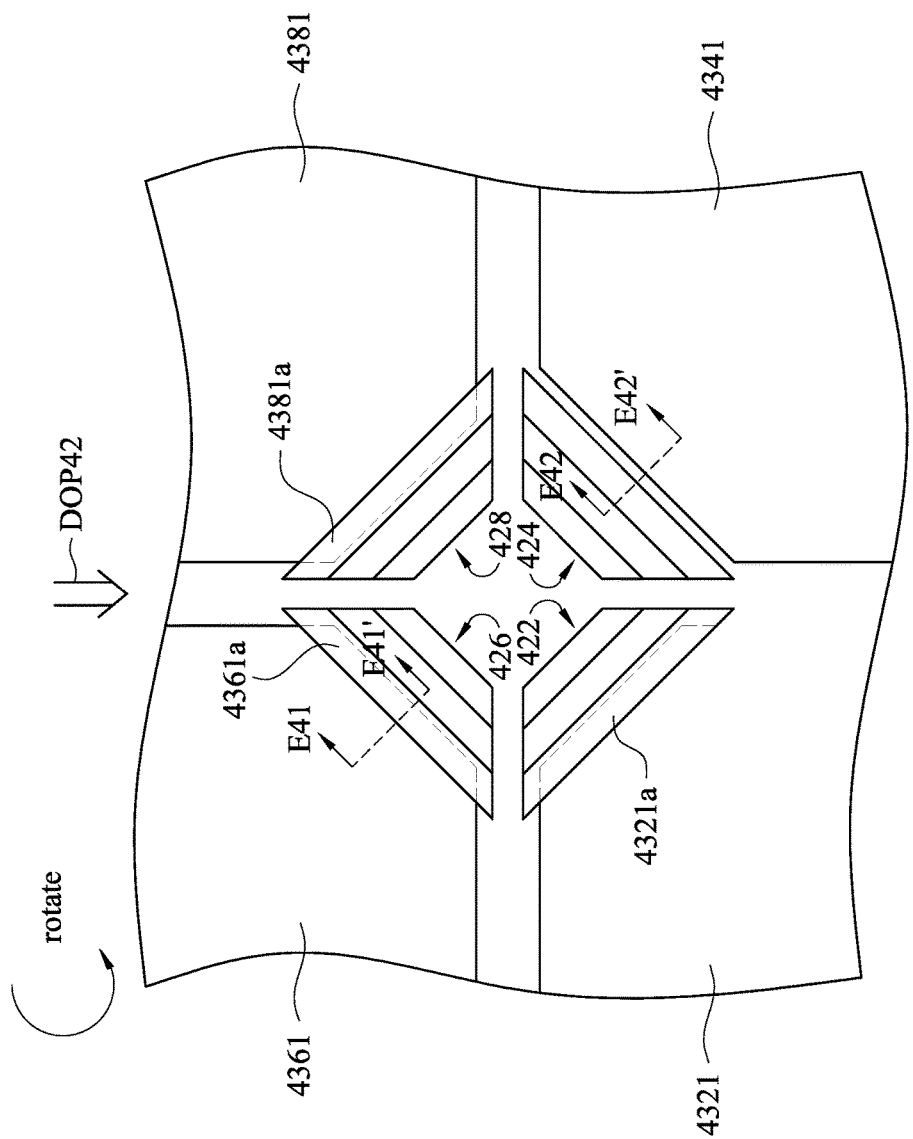
Figure 4E:
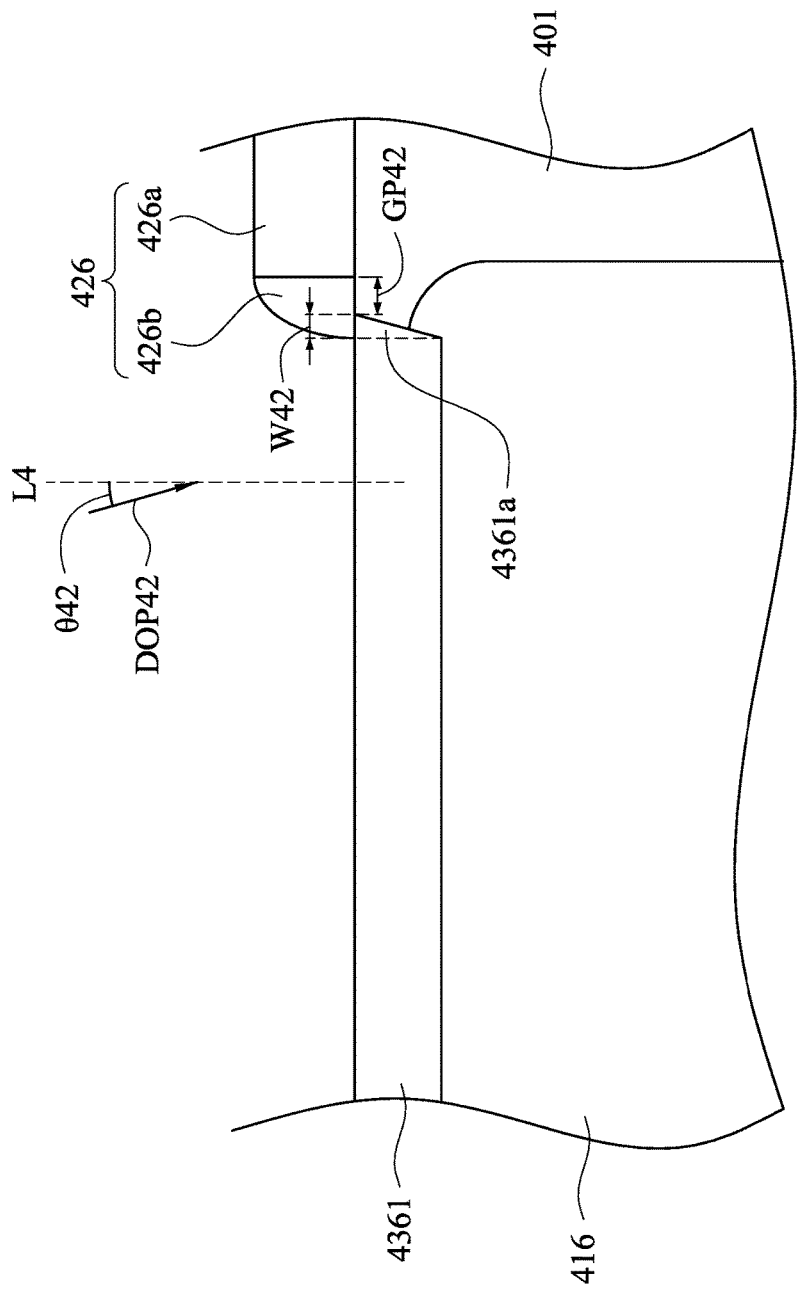
Figure 4F:
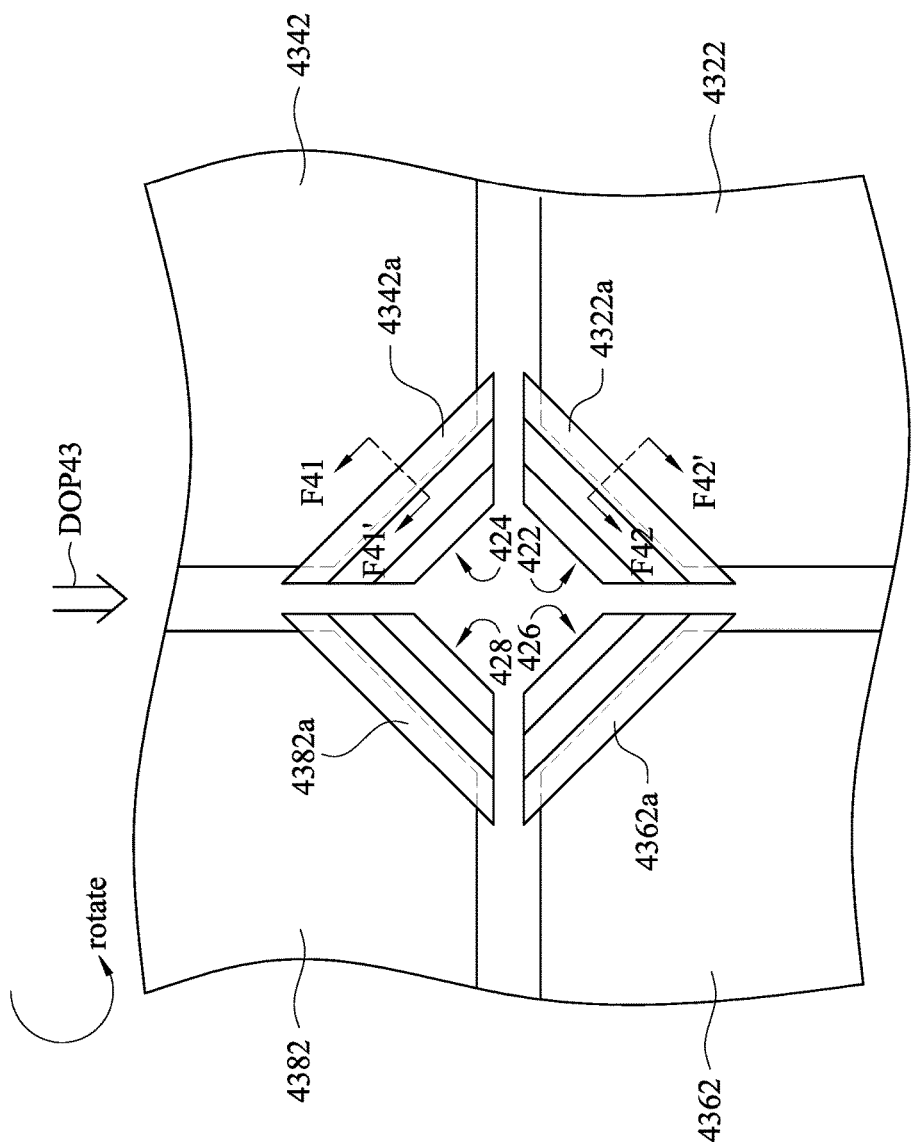
Figure 4F:
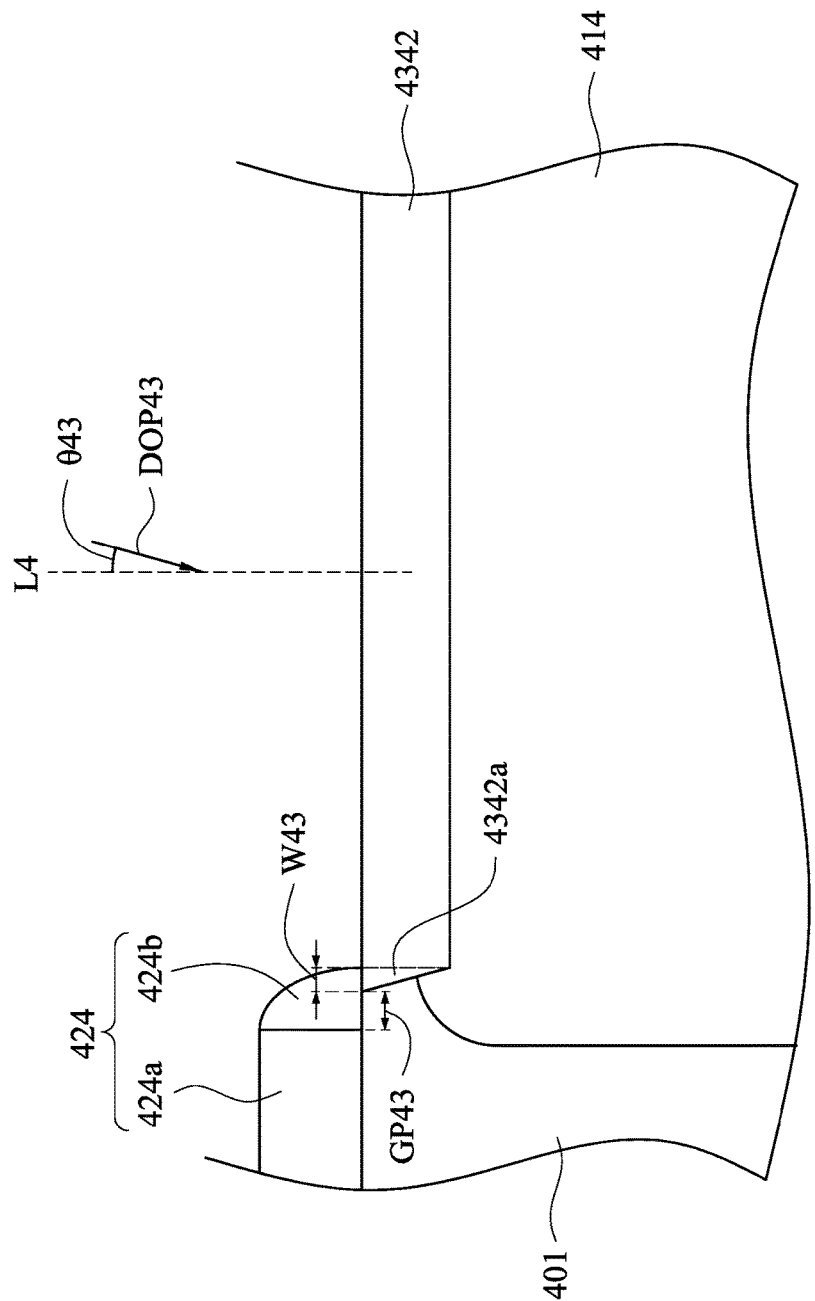
Figure 4G:
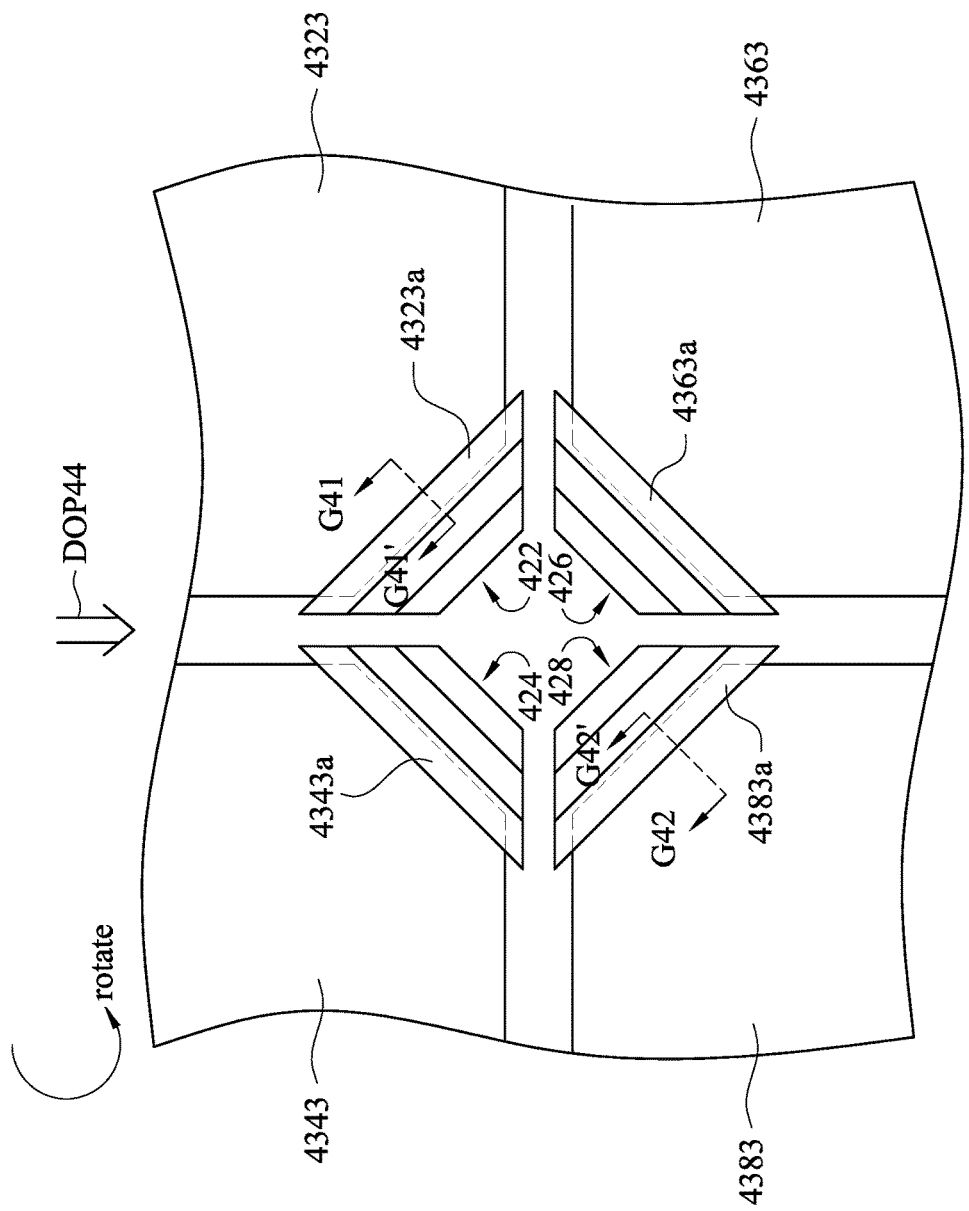
Figure 4G:
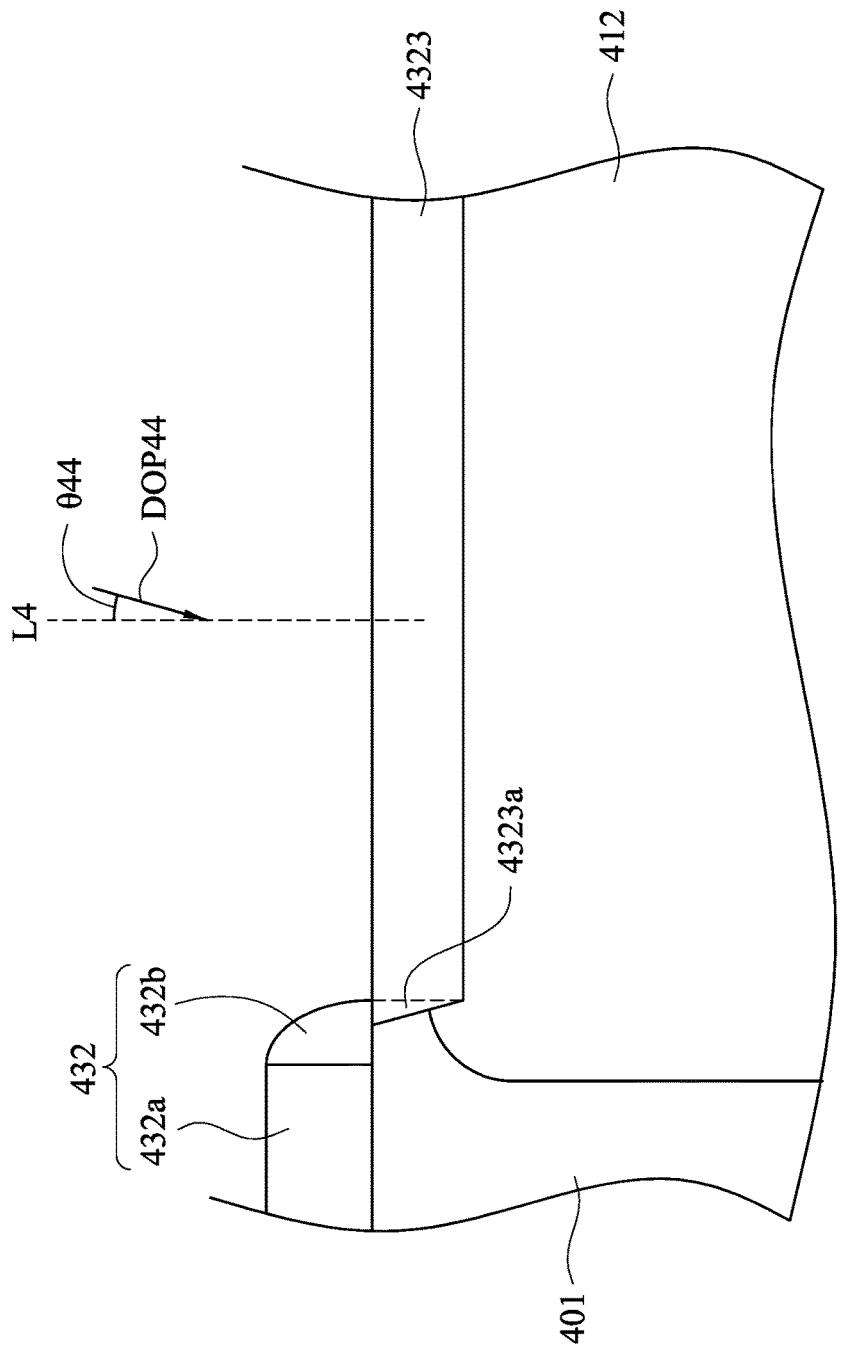
Figure 4G:
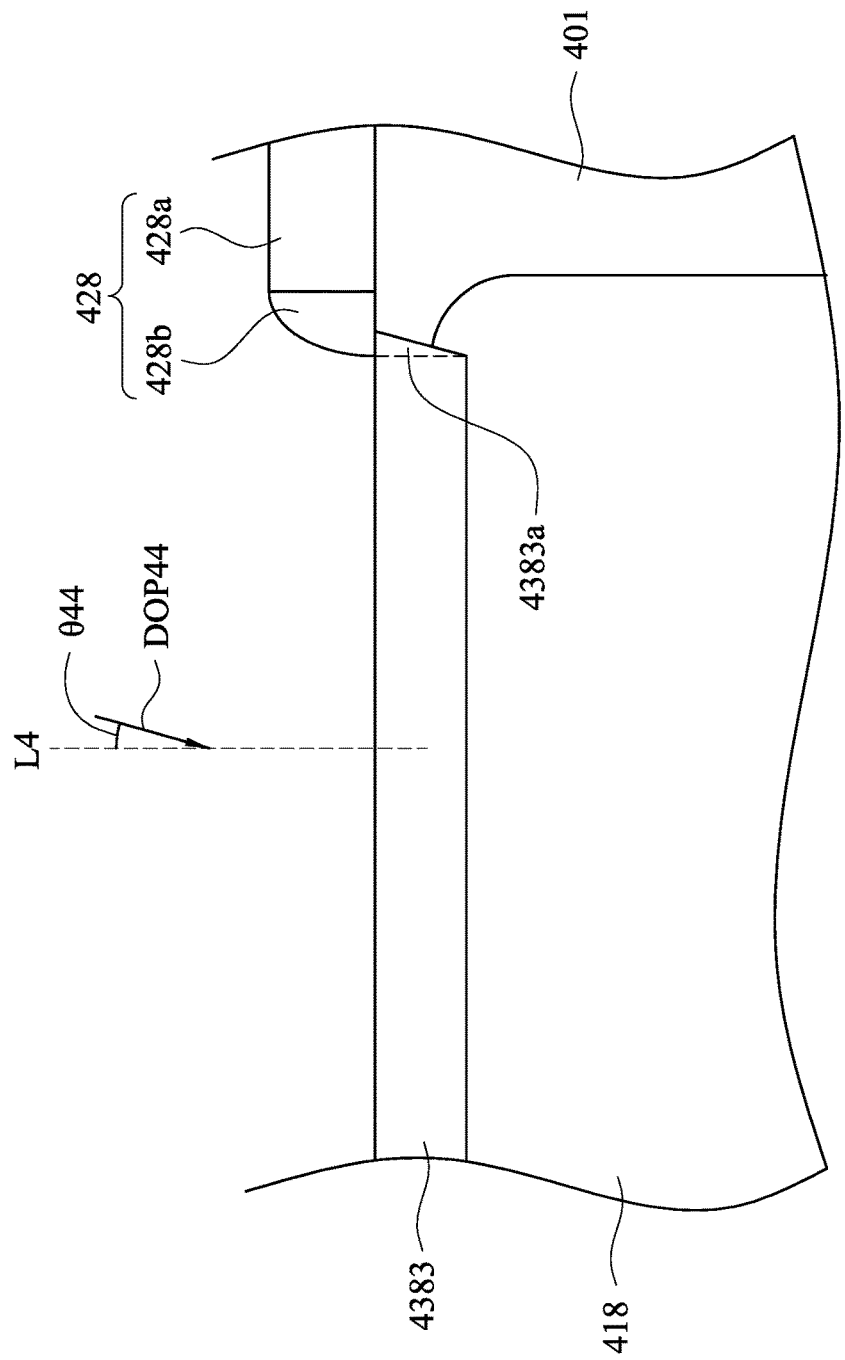

Referring to FIG. 4A to FIG. 4G''', FIG. 4A, FIG. 4B, FIG. 4C, FIG. 4D, FIG. 4E, FIG. 4F and FIG. 4G are schematic top views of intermediate stages showing a method for fabricating a pixel structure of an image sensor in accordance with some embodiments of the present disclosure, and FIG. 4A', FIG. 4B', FIG. 4C', FIG. 4D', FIG. 4D'', FIG. 4E', FIG. 4E'', FIG. 4F', FIG. 4F'', FIG. 4G' and FIG. 4G'' are schematic cross-sectional views of the intermediate stages shown in FIG. 4B, FIG. 4C, FIG. 4D, FIG. 4E, FIG. 4F and FIG. 4G.

At first, a semiconductor substrate 401 is provided as shown in FIG. 4A and FIG. 4A', in which FIG. 4A' is a schematic cross-sectional view of FIG. 4A. In some embodiments, the semiconductor substrate 401 may be a semiconductor material and may include structures including a graded layer or a buried oxide, for example. In some exemplary examples, the semiconductor substrate 401 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 401. Alternatively, the semiconductor substrate 401 may be an active layer of a semiconductor-on-insulator (SOI) substrate or a multi-layered structure such as a silicon-germanium layer formed on a bulk silicon layer.

Then, light-sensitive regions 412, 414, 416 and 418 are formed in the semiconductor substrate 401 as shown in FIG. 4B and FIG. 4B', in which FIG. 4B' is a schematic cross-sectional view along a cutline B4-B4' in FIG. 4B. The light-sensitive regions 412, 414, 416 and 418 are doped with a dopant of a first type. In some embodiments, the light-sensitive regions 412, 414, 416 and 418 are doped with an n-type dopant, but embodiments of the present disclosure are not limited thereto. In some embodiments, isolation structures are formed between the light-sensitive regions 412, 414, 416 and 418 to separate the light-sensitive regions 412, 414, 416 and 418 from each other. In some embodiments, the isolation structures are regions doped with a p-type dopant.

Thereafter, plural transfer gates 422, 424, 426 and 428 are formed corresponding to the light-sensitive regions 412, 414, 416 and 418 as shown in FIG. 4C and FIG. 4C', in which FIG. 4C' is a schematic cross-sectional view along a cutline C4-C4' in FIG. 4C. Each of the transfer gates 422, 424, 426 and 428 includes a gate stack and spacers disposed on sidewalls of the gate stack. For example, the transfer gate 422 includes a gate stack 422a and spacers 422b. For another example, the transfer gate 424 includes a gate stack 422a and spacers 422b. For further another example, the transfer gate 426 includes a gate stack 426a and spacers 426b. For still another example, the transfer gate 428 includes a gate stack 428a and spacers 428b. In some embodiments, each of the gate stacks of the transfer gates 422, 424, 426 and 428 includes a gate dielectric layer and a gate electrode layer disposed on the gate dielectric layer, but embodiments of the present disclosure are not limited thereto.

Then, a first doping process is performed on the semiconductor substrate 401 to form protection layers 432, 434, 436 and 438 as shown in FIG. 4D, FIGS. 4D' and 4D'', in which FIG. 4D' is a schematic cross-sectional view along a cutline D41-D41' in FIG. 4D, and FIG. 4D'' is a schematic cross-sectional view along a cutline D42-D42' in FIG. 4D.

The protection layers 432, 434, 436 and 438 are formed on the light-sensitive regions 412, 414, 416 and 418 in a one-to-one manner. For example, the protection layer 432 is formed on the light-sensitive regions 412. For another example, the protection layer 434 is formed on the light-sensitive regions 414. For further another example, the protection layer 436 is formed on the light-sensitive regions 416. For still another example, the protection layer 438 is formed on the light-sensitive regions 418. In some embodiments, the protection layers 432, 434, 436 and 438 are formed by doping the semiconductor substrate 401 with a dopant of a second type different from the first type. In some embodiments, the protection layers 432, 434, 436 and 438 are formed by doping with a p-type dopant. Therefore, the protection layers 432, 434, 436 and 438 may be referred to as pinning layers corresponding to the light-sensitive regions 412, 414, 416 and 418.

The first doping process is performed with a tilt angle θ41 as shown in FIG. 4D' and FIG. 4D''. For example, a normal L4 perpendicular to a surface of the semiconductor substrate 401 is defined, and the first doping process is performed along a doping direction DOP41 tilting toward the transfer gate 424. Therefore, the tilt angle θ41 included between the doping direction DOP41 and the normal L4 is greater than zero.

Because the first doping process is performed with the doping direction DOP41, the protection layers 432 and 436 have terminal portions 432a and 436a covered by the transfer gates 422 and 426, and each of the protection layers 434 and 438 does not have a terminal portion covered by the transfer gates 424 and 428. For example, the protection layer 432 has a terminal portion 432a covered by the spacer 422b of the transfer gate 422 as shown in FIG. 4D'. For another example, the protection layer 434 does not have a portion covered by the transfer gate 424 as shown in FIG. 4D''.

Further, each of the terminal portions 432a and 436a of the protection layers 432 and 436 is formed to have a width progressively decreased along a depthwise direction, and the terminal portions 432a and 436a of the protection layers 432 and 436 do not extend to corresponding gate stacks. For example, as shown in FIG. 4D', the protection layer 432 has a terminal portion 432a. A width W41 of the terminal portion 432a is progressively decreased along a depthwise direction of the terminal portion 432a of the protection layer 432. Further, a distance GP41 between the terminal portion 432a and the gate stack 422a is greater than zero.

Thereafter, the semiconductor substrate 401 is counterclockwise rotated by 90 degrees and a second doping process is performed on the semiconductor substrate 401 to form protection layers 4321, 4341, 4361 and 4381, as shown in FIG. 4E, FIGS. 4E' and 4E'', in which FIG. 4E' is a schematic cross-sectional view along a cutline E41-E41' in FIG. 4E, and FIG. 4E" is a schematic cross-sectional view along a cutline E42-E42' in FIG. 4E. The protection layers 4321, 4341, 4361 and 4381 are similar to the protection layers 432, 434, 436 and 438. However, a dopant concentration of each of the protection layers 4321, 4341, 4361 and 4381 is greater than a dopant concentration of the protection layers 432, 434, 436 and 438. In some embodiments, a dopant concentration used for the first doping process is the same as a dopant concentration used for the second doping process, and thus the dopant concentration of each of the protection layers 4321, 4341, 4361 and 4381 is twice as the dopant concentration of each of the protection layers 432, 434, 436 and 438. In addition, the protection layers 4321 and 4361 have terminal portions 4321a and 4361a covered by the transfer gates 422 and 426.

The second doping process is performed with a tilt angle θ42 as shown in FIG. 4E' and FIG. 4E". For example, the second doping process is performed along a doping direction DOP42 tilting toward the transfer gate 424. Therefore, the tilt angle θ42 included between the doping direction DOP42 and the normal L4 is greater than zero.

Because the semiconductor substrate 401 is counterclockwise rotated by 90 degrees and the second doping process is performed with the doping direction DOP42, the protection layer 4381 has a terminal portion 4381a covered by the transfer gate 428. For example, the protection layer 4381 has a terminal portion 4381a covered by the spacer 428b of the transfer gate 428 as shown in FIG. 4E'. Further, the protection layer 4341 does not have a portion covered by the transfer gate 424 as shown in FIG. 4E".

In addition, the terminal portion 4381a of the protection layer 4381 is formed to have a width progressively decreased along a depthwise direction, and the terminal portion 4381a of the protection layer 4381 do not extend to the gate stack 428a. For example, as shown in FIG. 4E', a width W42 of the terminal portion 4381a is progressively decreased along a depthwise direction of the terminal portion 4381a of the protection layer 4381. Further, a distance GP42 between the terminal portion 4381a and the gate stack 428a is greater than zero.

Then, the semiconductor substrate 401 is counterclockwise rotated by 90 degrees and a third doping process is performed on the semiconductor substrate 401 to form protection layers 4322, 4342, 4362 and 4382, as shown in FIG. 4F, FIGS. 4F' and 4F", in which FIG. 4F' is a schematic cross-sectional view along a cutline F41-F41' in FIG. 4F, and FIG. 4F" is a schematic cross-sectional view along a cutline F42-F42' in FIG. 4F. The protection layers 4322, 4342, 4362 and 4382 are similar to the protection layers 4321, 4341, 4361 and 4381. However, a dopant concentration of each of the protection layers 4322, 4342, 4362 and 4382 is greater than a dopant concentration of the protection layers 4321, 4341, 4361 and 4381. In some embodiments, a dopant concentration used for the third doping process is the same as the dopant concentration used for the second doping process, and thus the dopant concentration of each of the protection layers 4322, 4342, 4362 and 4382 is three times the dopant concentration of each of the protection layers 432, 434, 436 and 438. In addition, the protection layers 4322, 4362 and 4382 have terminal portions 4322a, 4362a and 4382a covered by the transfer gates 422, 426 and 428.

The third doping process is performed with a tilt angle θ43 as shown in FIG. 4F' and FIG. 4F". For example, the third doping process is performed along a doping direction DOP43 tilting toward the transfer gate 422. Therefore, the tilt angle θ43 included between the doping direction DOP43 and the normal L4 is greater than zero.

Because the semiconductor substrate 401 is counterclockwise rotated by 90 degrees and the third doping process is performed with the doping direction DOP43, the protection layer 4381 has a terminal portion 4381a covered by the transfer gate 428. For example, the protection layer 4342 has a terminal portion 4342a covered by the spacer 424b of the transfer gate 424 as shown in FIG. 4F'.

In addition, the terminal portion 4342a of the protection layer 4342 is formed to have a width progressively decreased along a depthwise direction, and the terminal portion 4342a of the protection layer 4342 do not extend to the gate stack 424a. For example, as shown in FIG. 4F', a width W43 of the terminal portion 4342a is progressively decreased along a depthwise direction of the terminal portion 4342a of the protection layer 4342. Further, a distance GP43 between the terminal portion 4342a and the gate stack 424a is greater than zero.

Thereafter, the semiconductor substrate 401 is counterclockwise rotated by 90 degrees and a fourth doping process is performed on the semiconductor substrate 401 to form protection layers 4323, 4343, 4363 and 4383, as shown in FIG. 4G, FIGS. 4G' and 4G", in which FIG. 4G' is a schematic cross-sectional view along a cutline G41-G41' in FIG. 4G, and FIG. 4G" is a schematic cross-sectional view along a cutline G42-G42' in FIG. 4G. The protection layers 4323, 4343, 4363 and 4383 are similar to the protection layers 4322, 4342, 4362 and 4382. However, a dopant concentration of each of the protection layers 4323, 4343, 4363 and 4383 is greater than a dopant concentration of the protection layers 4322, 4342, 4362 and 4382. In some embodiments, a dopant concentration used for the fourth doping process is the same as the dopant concentration used for the third doping process, and thus the dopant concentration of each of the protection layers 4323, 4343, 4363 and 4383 is four times the dopant concentration of each of the protection layers 432, 434, 436 and 438. In addition, the protection layers 4323, 4343, 4363 and 4383 have terminal portions 4323a, 4343a, 4363a and 4383a covered by the transfer gates 422, 424, 426 and 428.

The fourth doping process is performed with a tilt angle θ44 as shown in FIG. 4G' and FIG. 4G". For example, the fourth doping process is performed along a doping direction DOP43 tilting toward the transfer gate 422. Therefore, the tilt angle θ44 included between the doping direction DOP44 and the normal L4 is greater than zero.

In some embodiments, the first doping process, the second doping process, the third doping process and the fourth doping process are performed in accordance with a target concentration. For example, when the target concentration is predetermined to be 1E13 atoms/cm$^3$, each of the first doping process, the second doping process, the third doping process and the fourth doping process is performed to dope the semiconductor substrate 401 with a concentration of 0.25E13 atoms/cm$^3$ to enable the each of the protection layers 4323, 4343, 4363 and 4383 to have a concentration of 1E13 atoms/cm$^3$.

Figure 5:
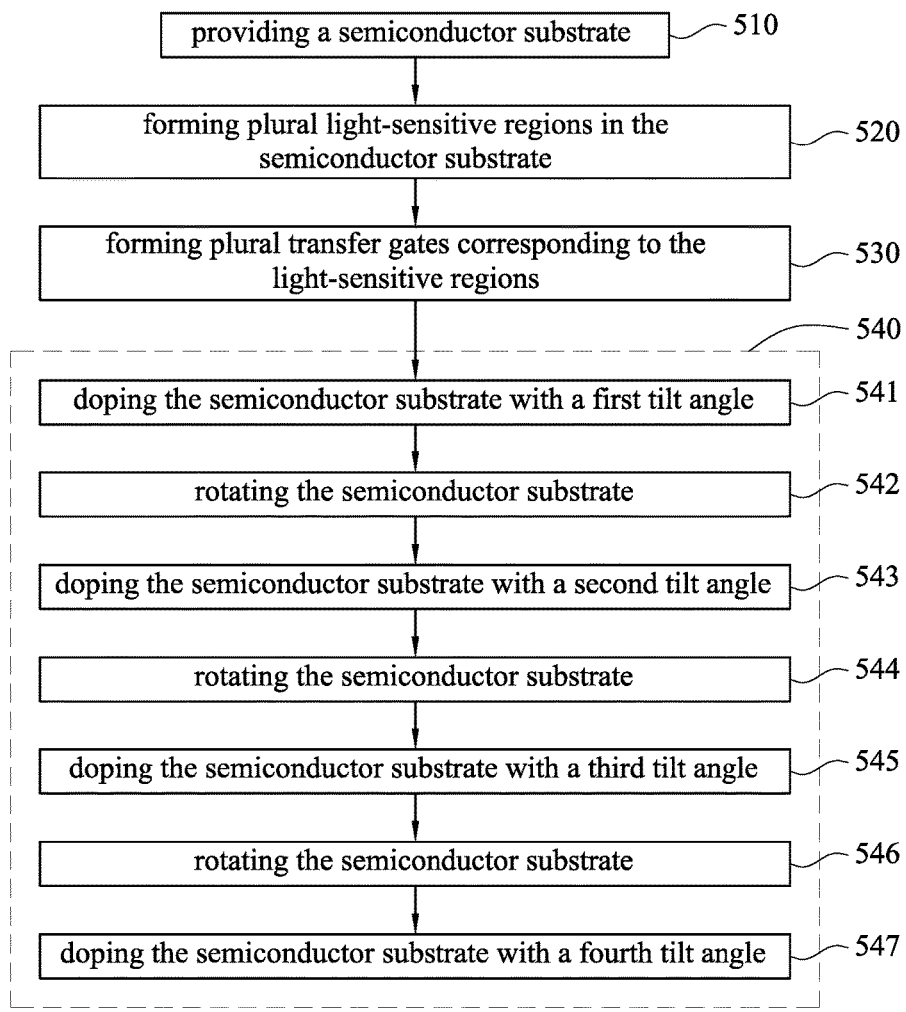
FIG. 5 is a flow chart showing a method for fabricating a pixel structure in accordance with embodiments of the present disclosure.

Referring to FIG. 5, FIG. 5 is a flow chart showing a method 500 for fabricating a pixel structure in accordance with embodiments of the present disclosure. The method 500 begins at operation 510. Operation 510 is performed to provide the semiconductor substrate 401 as shown in FIG. 4A and FIG. 4A'.

Then, operation 520 is performed to form plural light-sensitive regions 412, 414, 416 and 418 in the semiconductor substrate 501 as shown in FIG. 4B and FIG. 4B'.

Operation 520 can be performed by using ion implantation, but embodiments of the present disclosure are not limited thereto.

Thereafter, operation 530 is performed to form the transfer gates 422, 424, 426 and 428 corresponding to the light-sensitive regions 412, 414, 416 and 418 as shown in FIG. 4C and FIG. 4C'.

Then, operation 540 is performed to form plural protection layers on the light-sensitive regions 412, 414, 416 and 418 in a one-to-one manner. In some embodiments, each of the protection layers is designed to have a dopant concentration of about 1E13 atoms/cm$^3$. However, embodiments of the present disclosure are not limited thereto.

In operation 540, at first, operation 541 is performed to dope the semiconductor substrate 401 with a first tilt angle as shown in FIG. 4D, FIG. 4D' and FIG. 4D". Therefore, the protection layers 432, 434, 436 and 438 are formed on the light-sensitive regions 412, 414, 416 and 418 in a one-to-one manner.

Thereafter, operation 542 is performed to counterclockwise rotate the semiconductor substrate 401, and then operation 543 is performed to dope the semiconductor substrate 401 with a second tilt angle as shown in FIG. 4E, FIG. 4E' and FIG. 4E". Therefore, the protection layers 4321, 4341, 4361 and 4381 are formed on the light-sensitive regions 412, 414, 416 and 418 in a one-to-one manner.

Thereafter, operation 544 is performed to counterclockwise rotate the semiconductor substrate 401, and then operation 545 is performed to dope the semiconductor substrate 401 with a third tilt angle as shown in FIG. 4F, FIG. 4F' and FIG. 4F". Therefore, the protection layers 4322, 4342, 4362 and 4382 are formed on the light-sensitive regions 412, 414, 416 and 418 in a one-to-one manner.

Thereafter, operation 546 is performed to counterclockwise rotate the semiconductor substrate 401, and then operation 545 is performed to dope the semiconductor substrate 401 with a fourth tilt angle as shown in FIG. 4G, FIG. 4G' and FIG. 4G". Therefore, the protection layers 4323, 4343, 4363 and 4383 are formed on the light-sensitive regions 412, 414, 416 and 418 in a one-to-one manner.

In some embodiments, operations 542, 544, and 546 are performed to clockwise rotate the semiconductor substrate 401. In some embodiments, the first tilt angle, the second tilt angle, the third tilt angle and the fourth tilt angle are designed to be equal to each other.

In the embodiments of the present disclosure, the semiconductor substrate is doped with a tilt angle, thereby forming a protection layer having a tapered terminal portion.

Figure 6:
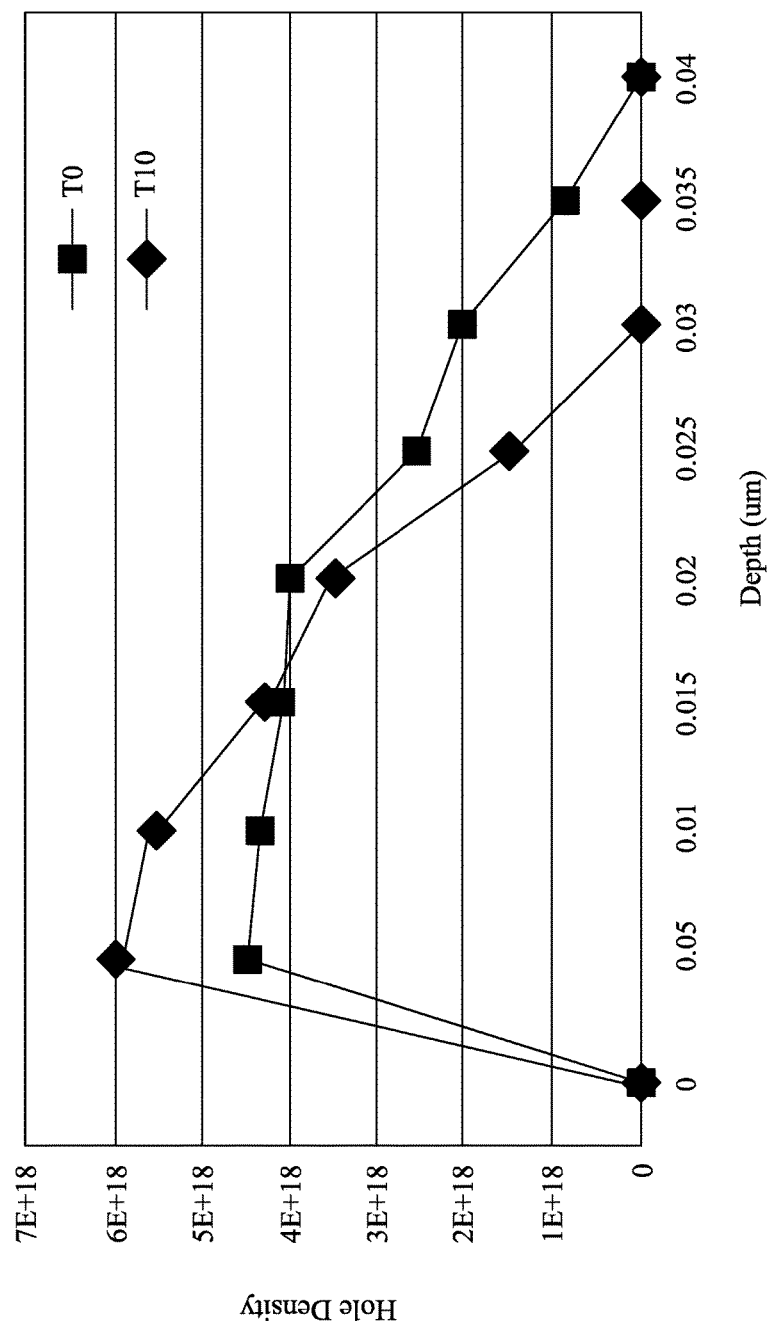
FIG. 6 is a schematic diagram showing relationships between hole density of the protection layer and the depth of the protection layer in accordance with some embodiments of the present disclosure.

Referring to FIG. 6, FIG. 6 is a schematic diagram showing relationships between hole density of the protection layer and the depth of the protection layer, in which the curve TO represents the protection layer formed by doping with a tilt angle equal to 0 degree, and the curve TO represents the protection layer formed by doping with a tilt angle equal to 0 degree, and the curve T10 represents the protection layer formed by doping with a tilt angle equal to 10 degrees. It can be understood form FIG. 6 that the protection layer formed by doping with the tilt angle equal to 10 degree has better performance on hole density.

Figure 7:
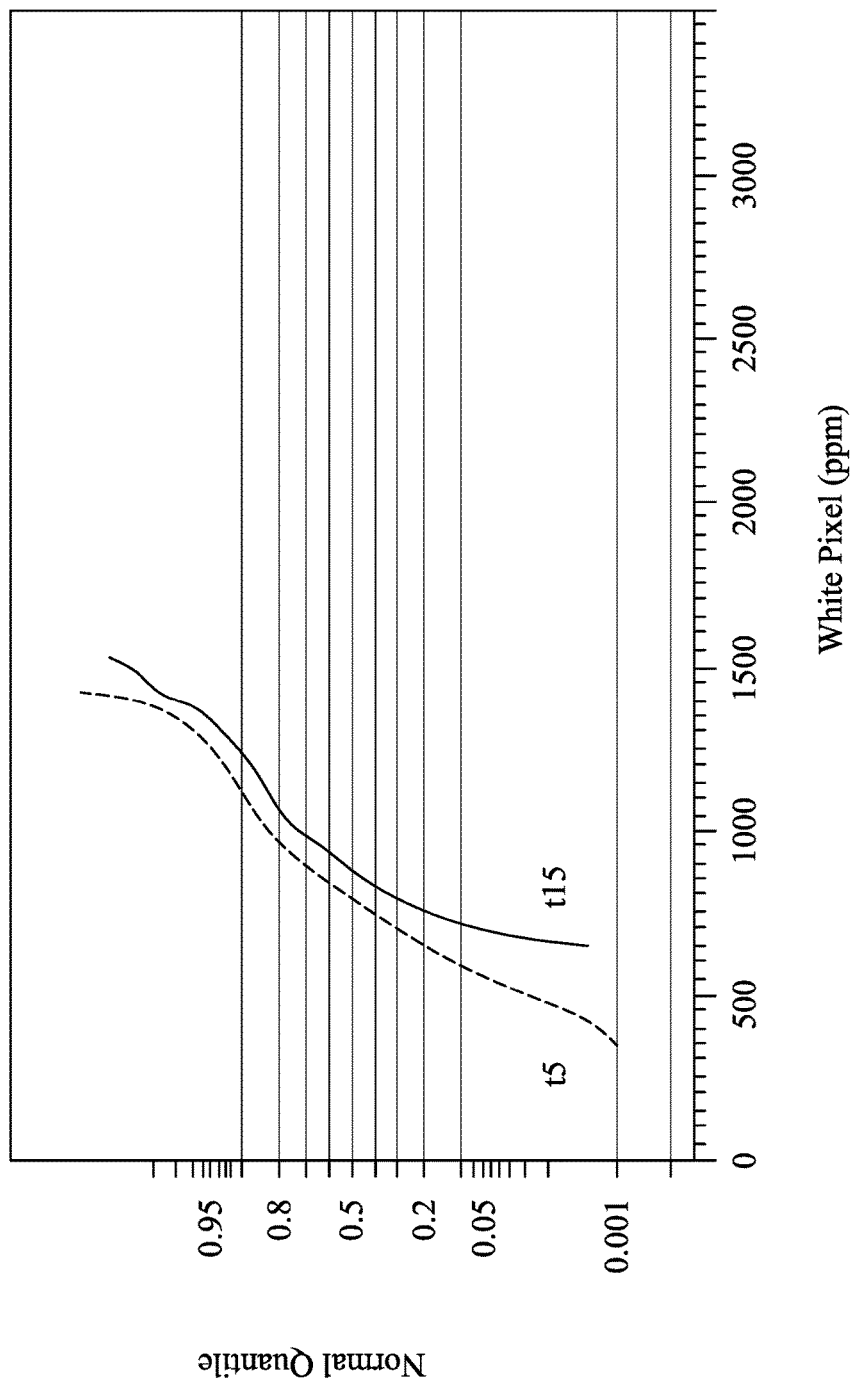
FIG. 7 is a schematic diagram showing performance of white pixel of different wafers in accordance with some embodiments of the present disclosure.

Referring to FIG. 7, FIG. 7 is a schematic diagram showing performance of white pixel of different wafers, in which the curve T5 represents a wafer adopting a protection layer formed by doping with a tilt angle equal to 5 degrees, and the curve T15 represents a second wafer adopting a protection layer formed by doping with a tilt angle equal to 15 degrees. It can be understood form FIG. 7 that the second wafer has better performance on white pixel.

In accordance with an embodiment of the present disclosure, the present disclosure discloses a pixel structure of an image sensor. The pixel structure includes a semiconductor substrate and plural pixel units disposed on the semiconductor substrate. The pixel units are electrically connected to each other, and each of the pixel units includes a light-sensitive region, a transfer gate and a protection layer. The light-sensitive region is disposed in the semiconductor substrate. The transfer gate is disposed on the semiconductor substrate. The protection layer is disposed on the light-sensitive region. A terminal portion of the protection layer is covered by the transfer gate, and a width of the terminal portion of the protection layer is progressively decreased along a depthwise direction of the terminal portion of the protection layer.

In accordance with another embodiment of the present disclosure, the present disclosure discloses a method for fabricating a pixel structure of an image sensor. In the method, at first, a semiconductor substrate is provided. Then, plural light-sensitive regions are formed in the semiconductor substrate. Thereafter, a first mask is formed to cover a first part of the light-sensitive regions, in which a second part of the light-sensitive regions is not covered by the first mask. Then, plural first protection layers are formed on the second part of the light-sensitive regions by doping the semiconductor substrate with a first tilt angle. Thereafter, the first mask is removed to expose the first part of the light-sensitive regions. Then, a second mask is formed to cover the second part of the light-sensitive regions and the first protection layers, in which the first part of the light-sensitive regions is not covered by the second mask. Thereafter, plural second protection layers are formed on the first part of the light-sensitive regions by doping the semiconductor substrate with a second tilt angle. Then, plural transfer gates are formed corresponding to the light-sensitive regions, in which each of the transfer gates is formed to cover a terminal portion of a corresponding one of the protection layers, and a width of the terminal portion of the corresponding one of the protection layers is progressively decreased along a depthwise direction of the terminal portion of the corresponding one of the protection layers.

In accordance with another embodiment of the present disclosure, the present disclosure discloses a method for fabricating a pixel structure of an image sensor. In the method, at first, a semiconductor substrate is provided. Then, plural light-sensitive regions are formed in the semiconductor substrate. Thereafter, plural transfer gates are formed corresponding to the light-sensitive regions. Then, plural protection layers are formed on the light-sensitive regions in a one-to-one manner. In the operation for forming the protection layers, at first, a first doping operation is performed to dope the semiconductor substrate with a first tilt angle. Then, a first rotating operation is performed to rotate the semiconductor substrate after the first doping operation. Thereafter, a second doping operation is performed to dope the semiconductor substrate with a second tilt angle.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a pixel structure of an image sensor, the method comprising:
providing a semiconductor substrate:
forming a plurality of light-sensitive regions in the semiconductor substrate; forming a first mask to cover a first part of the light-sensitive regions, in which a second part of the light-sensitive regions is not covered by the first mask;
forming a plurality of first protection layers on the second part of the light-sensitive regions by doping the semiconductor substrate with a first tilt angle;
removing the first mask to expose the first part of the light-sensitive regions;
forming a second mask to cover the second part of the light-sensitive regions and the first protection layers, in which the first part of the light-sensitive regions is not covered by the second mask;
forming a plurality of second protection layers on the first part of the light-sensitive regions by doping the semiconductor substrate with a second tilt angle;
forming a plurality of transfer gates corresponding to the light-sensitive regions, wherein each of the transfer gates is formed to cover a terminal portion of a corresponding one of the second protection layers, and a width of the terminal portion of the corresponding one of the second protection layers is progressively decreased along a depthwise direction of the terminal portion of the corresponding one of the second protection layers.

2. The method of claim 1, wherein the forming of the transfer gates comprises:
forming a plurality of gate stacks corresponding to the light-sensitive regions; and
forming a plurality of spacers on a plurality of sidewalls of the gate stacks.

3. The method of claim 1, wherein the first tilt angle and the second tilt angle are greater than 0 degree.

4. The method of claim 1, wherein the first tilt angle is the same as the second tilt angle.

5. The method of claim 1, wherein the light-sensitive region is formed by doping with a dopant of a first type, and the plurality of second protection layers are formed by doping with a dopant of a second type different from the first type.

6. The method of claim 2, wherein the forming of the gate stacks is performed before the forming of the first protection layers.

7. The method of claim 2, wherein the doping of the semiconductor substrate is performed along a doping direction tilting toward the gate stacks.

8. A method for fabricating a pixel structure of an image sensor, the method comprising:
providing a semiconductor substrate;
forming a plurality of light-sensitive regions in the semiconductor substrate;
forming a plurality of transfer gates corresponding to the light-sensitive regions; and
forming a plurality of protection layers on the light-sensitive regions in a one-to-one manner, wherein the forming of the protection layers comprises:
performing a first doping operation to dope the semiconductor substrate with a first tilt angle;
performing a first rotating operation to rotate the semiconductor substrate after the first doping operation; and
performing a second doping operation to dope the semiconductor substrate with a second tilt angle;
wherein the first tilt angle and the second tilt angle are greater than 0 degree.

9. The method of claim 8, wherein the doping operations further comprise:
performing a second rotating operation to rotate the semiconductor substrate after the second doping operation;
performing a third doping operation to dope the semiconductor substrate with a third tilt angle after the second rotating operation;
performing a third rotating operation to rotate the semiconductor substrate after the third doping operation; and
performing a fourth doping operation to dope the semiconductor substrate with a fourth tilt angle after the third rotating operation.

10. The method of claim 8, wherein the forming of the transfer gates comprises:
forming a plurality of gate stacks corresponding to the light-sensitive regions; and
forming a plurality of spacers on a plurality of sidewalls of the gate stacks.

11. The method of claim 8, wherein the first tilt angle is the same as the second tilt angle.

12. The method of claim 8, wherein the light-sensitive region is formed by doping with a dopant of a first type, and the plurality of protection layers are formed by doping with a dopant of a second type different from the first type.

13. The image sensor of claim 9, wherein each of the first rotating operation, the second rotating operation, the third rotating operation and the fourth rotating operation is performed to clockwise rotate the semiconductor substrate by 90 degrees.

14. The image sensor of claim 9, wherein each of the first rotating operation, the second rotating operation, the third rotating operation and the fourth rotating operation is performed to counterclockwise rotate the semiconductor substrate by 90 degrees.

15. The method of claim 10, wherein the first doping operation and the second doping operation are performed to dope the semiconductor substrate along a doping direction tilting toward the gate stacks.

16. A method for fabricating a pixel structure of an image sensor, the method comprising:
providing a semiconductor substrate;
forming a first light-sensitive region, a second light-sensitive region, a third light-sensitive region and a fourth light-sensitive region in the semiconductor substrate, wherein the first light-sensitive region is located adjacent to the second light-sensitive region and the fourth light-sensitive region, and opposite to the third light-sensitive region;
forming a first transfer gate on the semiconductor substrate, wherein the first transfer gate is formed corresponding to the first light-sensitive region and covers a first portion of the semiconductor substrate adjacent the first light-sensitive region;
forming a second transfer gate on the semiconductor substrate, wherein the second transfer gate is formed corresponding to the second light-sensitive region and covers a second portion of the semiconductor substrate adjacent the first light-sensitive region;

forming a third transfer gate on the semiconductor substrate, wherein the third transfer gate is formed corresponding to the third light-sensitive region and covers a third portion of the semiconductor substrate adjacent the first light, sensitive region;

forming a fourth transfer gate on the semiconductor substrate, wherein the fourth transfer gate is formed corresponding to the fourth light-sensitive region and covers a fourth portion of the semiconductor substrate adjacent the first light-sensitive region; and forming a plurality of protection layers on the light-sensitive regions in a one-to-one manner, wherein the forming of the plurality of protection layers comprises: sequentially doping the first portion, the second portion, the third portion and the fourth portion of the semiconductor substrate;

wherein the forming of the plurality of protection layers further comprises;

covering the third and fourth portions of the semiconductor substrate with a first mask; and performing a first doping operation to dope the first and second portions of the semiconductor substrate with a first tilt angle using the first mask.

17. The method of claim 16, wherein the forming of the plurality of protection layers further comprises:

covering the first and second portions of the semiconductor substrate with a second mask.

18. The method of claim 17, wherein the forming of the plurality of protection layers further comprises:

performing a second doping operation to dope the third and fourth portions of the semiconductor substrate with a second tilt angle using the second mask.

19. The method of claim 18, wherein the first tilt angle and the second tilt angle are greater than 0 degree.

20. The method of claim 18, wherein the first tilt angle is the same as the second tilt angle.

* * * * *